(12) United States Patent
Kawamura

(10) Patent No.: US 12,159,843 B2
(45) Date of Patent: Dec. 3, 2024

(54) SEMICONDUCTOR DEVICE

(71) Applicant: Kioxia Corporation, Tokyo (JP)

(72) Inventor: Daisuke Kawamura, Kiyosu (JP)

(73) Assignee: Kioxia Corporation, Tokyo (JP)

( * ) Notice: Subject to any disclaimer, the term of this patent is extended or adjusted under 35 U.S.C. 154(b) by 565 days.

(21) Appl. No.: 17/472,474

(22) Filed: Sep. 10, 2021

(65) Prior Publication Data

US 2022/0302045 A1 Sep. 22, 2022

(30) Foreign Application Priority Data

Mar. 17, 2021 (JP) .................................. 2021-043697

(51) Int. Cl.
*H01L 23/00* (2006.01)
*H01L 23/48* (2006.01)
(Continued)

(52) U.S. Cl.
CPC .......... *H01L 23/562* (2013.01); *H01L 23/481* (2013.01); *H01L 23/5283* (2013.01); *H10B 41/10* (2023.02); *H10B 41/27* (2023.02); *H10B 41/40* (2023.02); *H10B 43/10* (2023.02); *H10B 43/27* (2023.02); *H10B 43/40* (2023.02)

(58) Field of Classification Search
CPC ........ H10B 41/10; H10B 41/23; H10B 41/27; H10B 41/30–41; H10B 43/10; H10B 43/20; H10B 43/30–50; H10B 20/00–10; H10B 20/20–25; H10B 20/27–50; H10B 43/00–50; H01L 23/544; H01L 23/562; H01L 23/48–482; H01L 23/498–49838; H01L 2223/54426; H01L 2924/145; H01L 2924/1453; H01L 23/525–5258; G11C 17/10–126; G11C 17/14–165;
(Continued)

(56) References Cited

U.S. PATENT DOCUMENTS

2018/0301374 A1* 10/2018 Masamori .............. H10B 43/40

FOREIGN PATENT DOCUMENTS

| JP | 10-189678 A | 7/1998 |
|---|---|---|
| JP | 2001-176780 A | 6/2001 |
| JP | 2004-235464 A | 8/2004 |

* cited by examiner

*Primary Examiner* — Mohammad A Rahman
*Assistant Examiner* — Eric Manuel Mulero Flores
(74) *Attorney, Agent, or Firm* — Oblon, McClelland, Maier & Neustadt, L.L.P.

(57) ABSTRACT

A semiconductor device according to an embodiment includes a lower layer wiring and a dummy wiring arranged in a first hierarchy, a contact arranged in a second hierarchy above the first hierarchy and connected to the lower layer wiring, and first and second plate-like portions arranged in the second hierarchy, extending in a stacking direction of each layer belonging to the second hierarchy and in a first direction intersecting with the stacking direction, and sandwiching the contact in a second direction intersecting with the stacking direction and the first direction at a position away from the contact, and the dummy wiring has at least three edges arranged at respective positions overlapping with one of the first and second plate-like portions in the stacking direction, and an orientation in which at least one of the three edges intersects with the first or second plate-like portion differs as viewed from the stacking direction from orientations in which the other edges intersect with the first or second plate-like portion.

20 Claims, 22 Drawing Sheets

(51) Int. Cl.
*H01L 23/528* (2006.01)
*H10B 41/10* (2023.01)
*H10B 41/27* (2023.01)
*H10B 41/40* (2023.01)
*H10B 43/10* (2023.01)
*H10B 43/27* (2023.01)
*H10B 43/40* (2023.01)

(58) Field of Classification Search
CPC .... G11C 16/0466–0475; G11C 27/005; G11C 11/5671
See application file for complete search history.

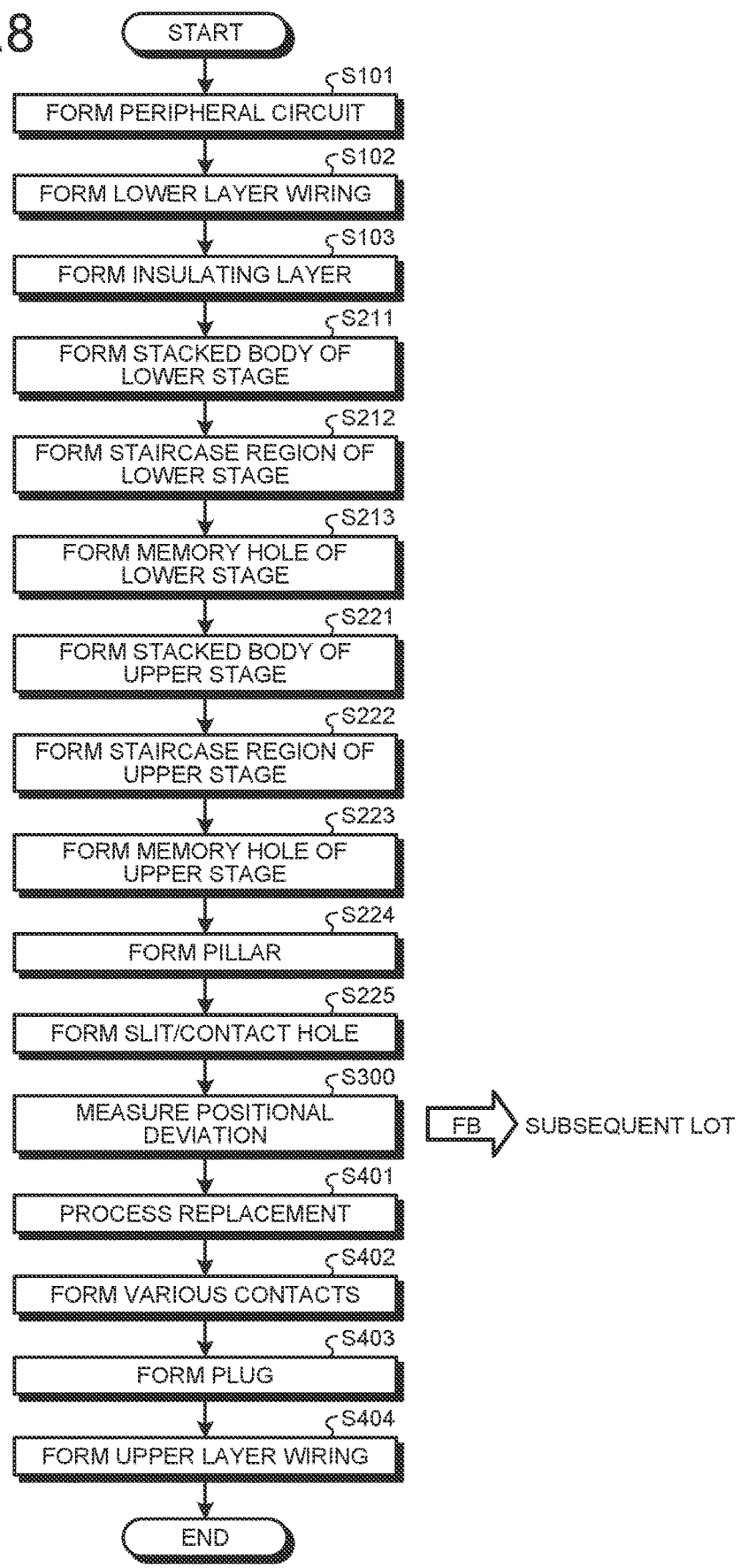

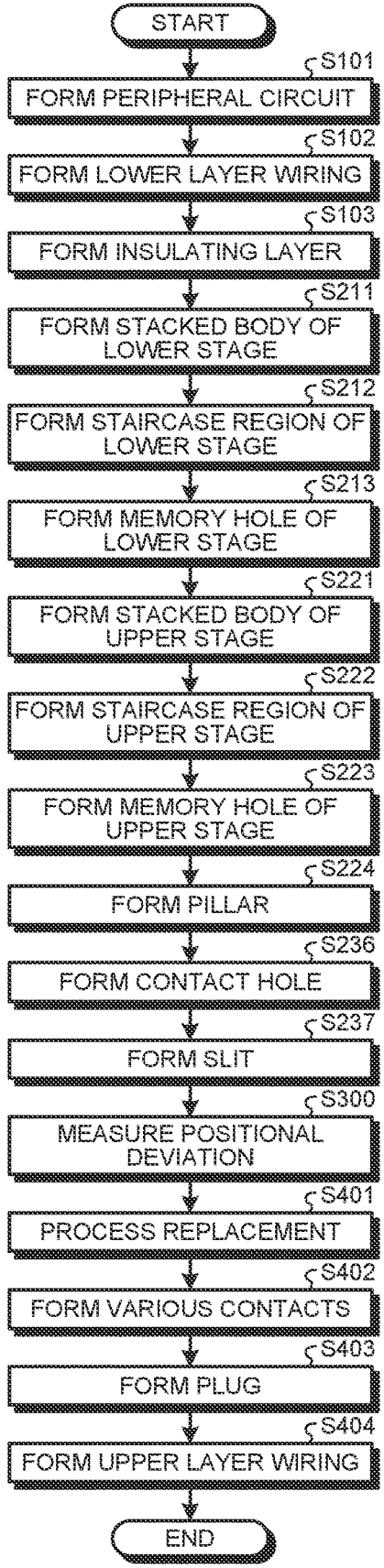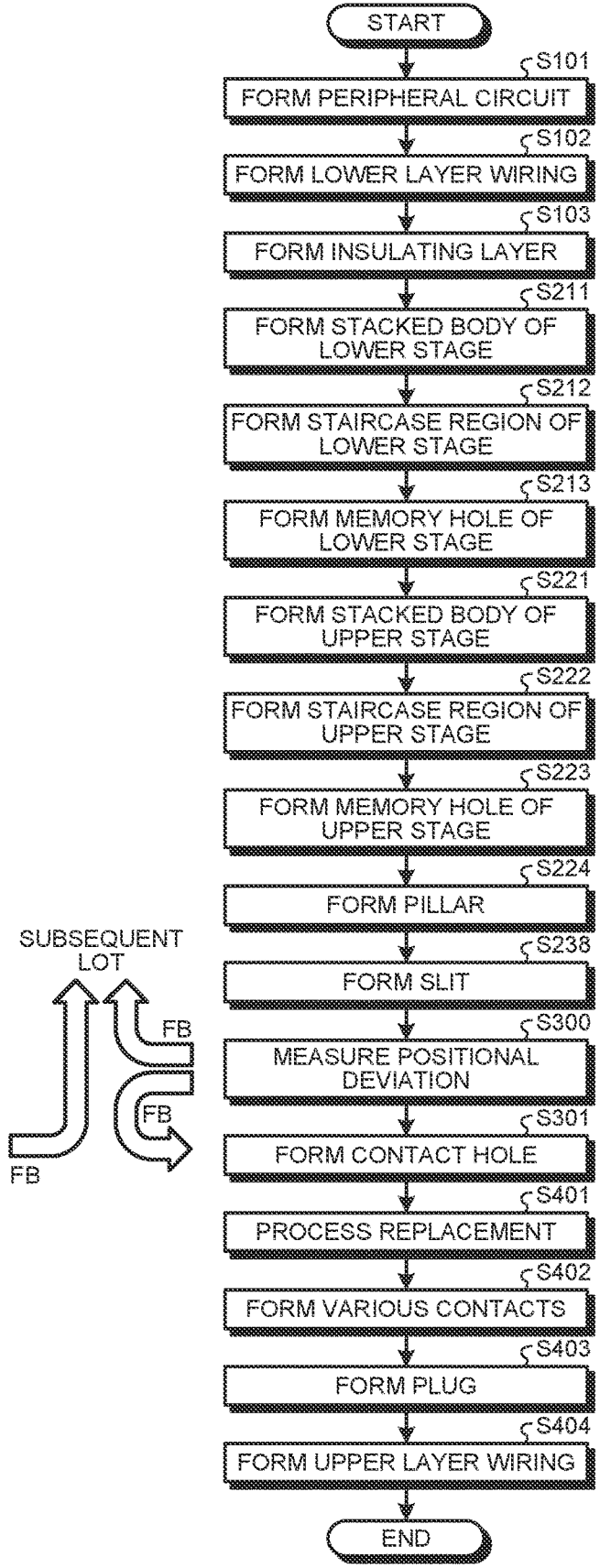

FIG.13A
FIG.13B
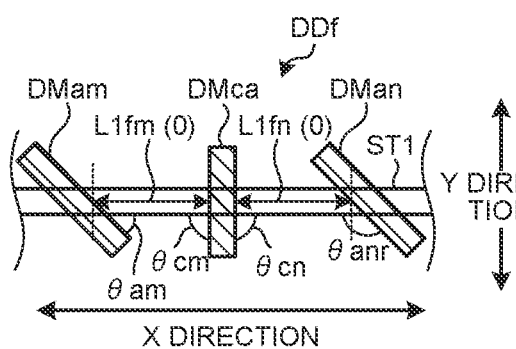
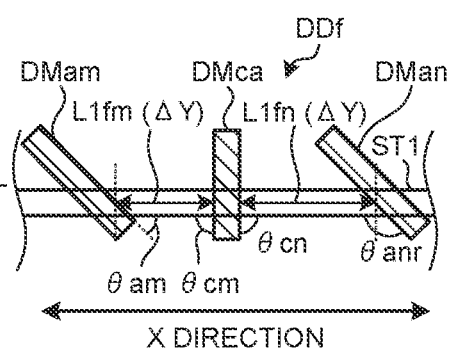

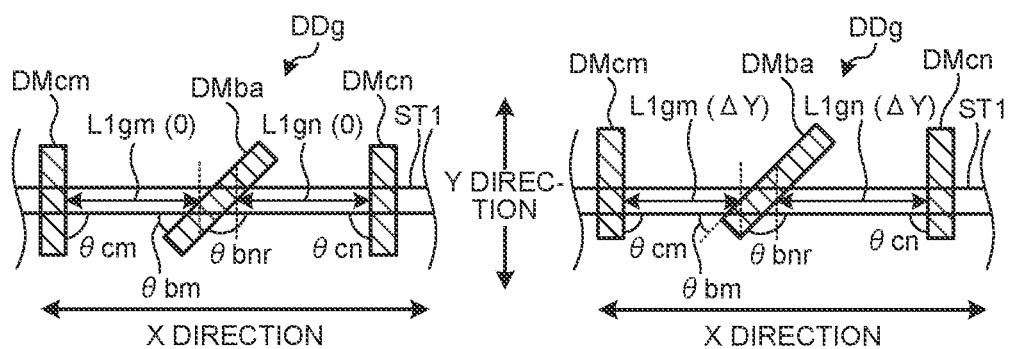
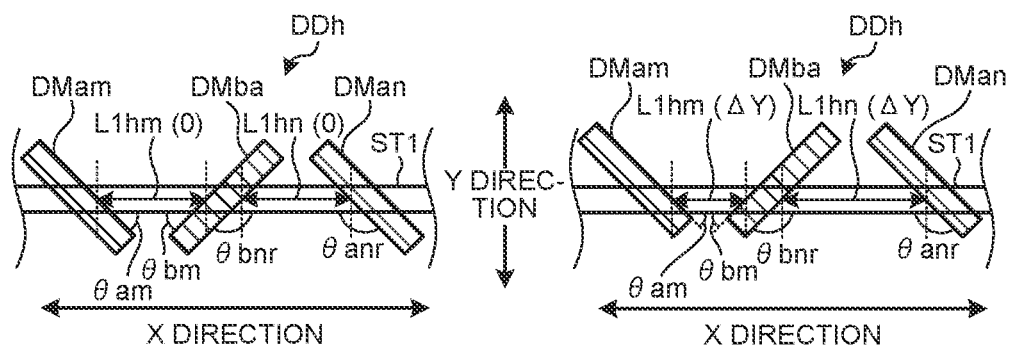

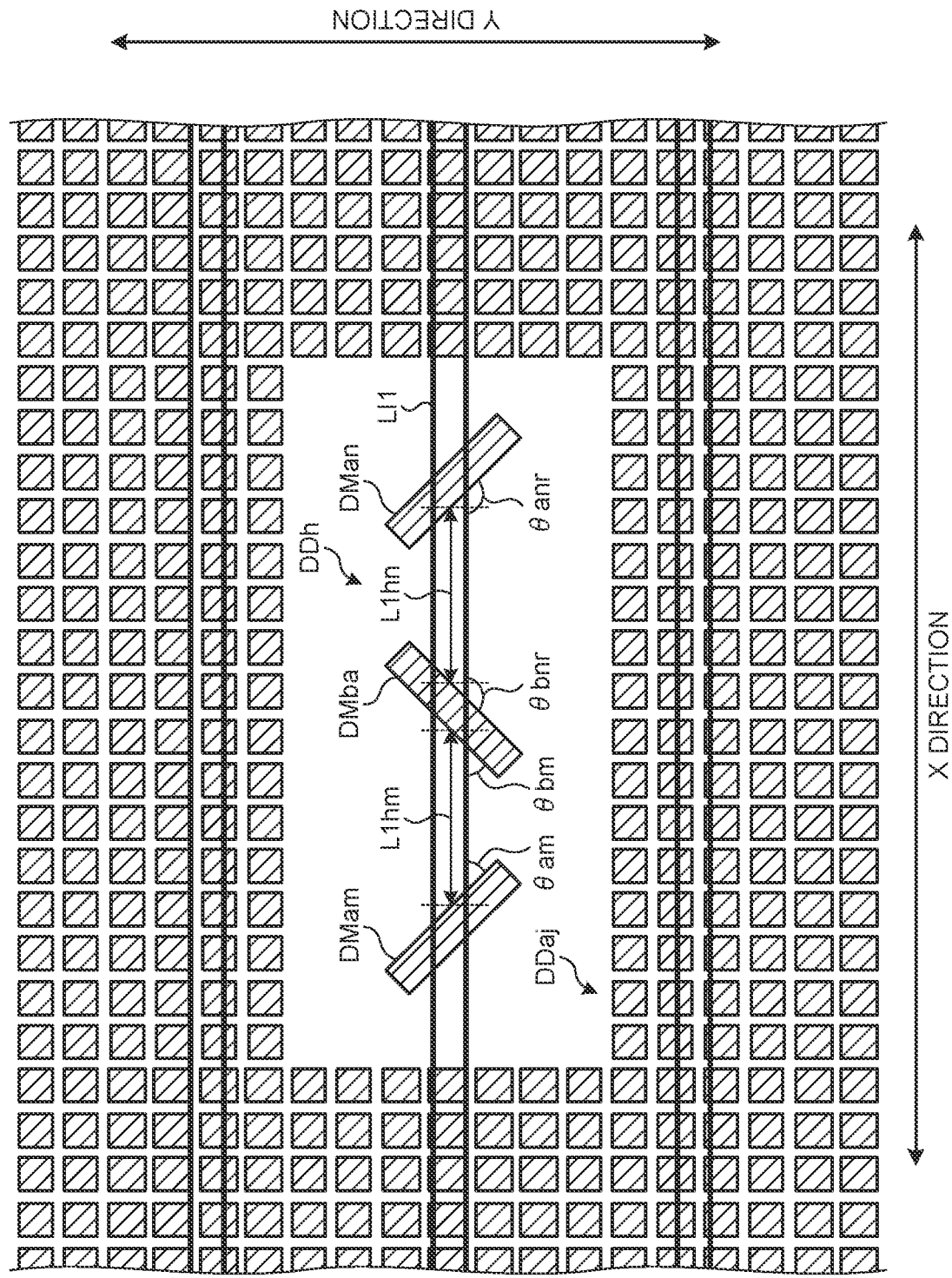

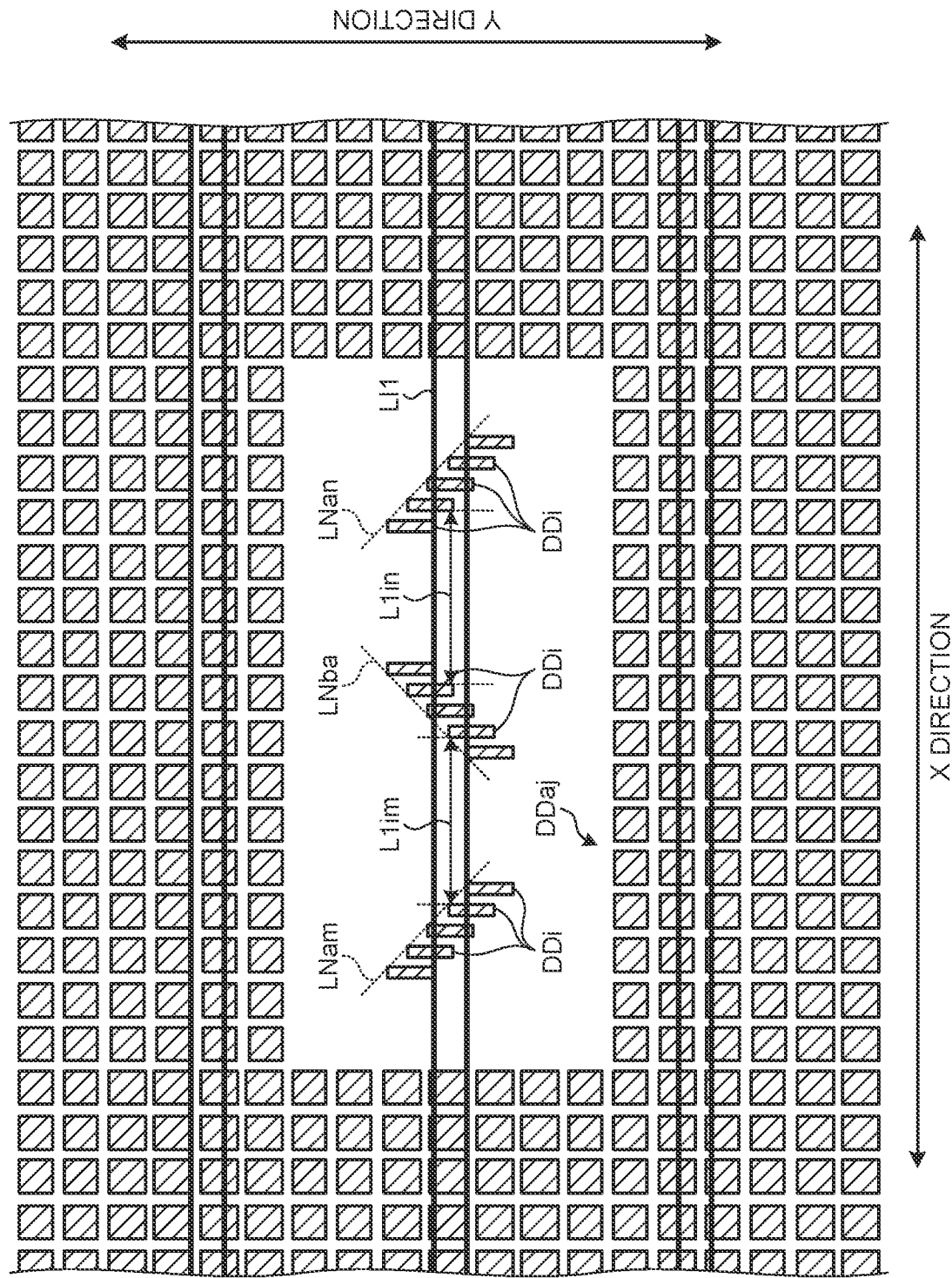

SEMICONDUCTOR DEVICE

CROSS-REFERENCE TO RELATED APPLICATIONS

This application is based upon and claims the benefit of priority from Japanese Patent Application No. 2021-043697, filed on Mar. 17, 2021; the entire contents of which are incorporated herein by reference.

FIELD

Embodiments described herein relate generally to a semiconductor device.

BACKGROUND

A semiconductor device has, for example, a stacked structure composed of a plurality of hierarchies. In each layer of the semiconductor device, stress can occur. Such stress causes positional deviation between structures arranged in different hierarchies, in some cases, making the connection between these structures faulty.

BRIEF DESCRIPTION OF THE DRAWINGS

FIG. 8 is a flowchart exemplarily illustrating some variations of the method for manufacturing the semiconductor device according to the first embodiment;

FIGS. 9A and 9B are flowcharts exemplarily illustrating some variations of the method for manufacturing the semiconductor device according to the first embodiment;

FIGS. 13A and 13B are diagrams schematically illustrating a configuration of the dummy wiring based on how to measure the positional deviation amount in a semiconductor device according to a second embodiment;

FIGS. 14A and 14B are diagrams schematically illustrating a configuration of the dummy wiring based on how to measure the positional deviation amount in the semiconductor device according to the second embodiment;

FIGS. 15A and 15B are diagrams schematically illustrating a configuration of the dummy wiring based on how to measure the positional deviation amount in the semiconductor device according to the second embodiment;

FIG. 16 is a diagram illustrating an example of application of the dummy wiring to the semiconductor device according to the second embodiment;

FIG. 17 is a diagram illustrating an example of application of the dummy wiring to the semiconductor device according to the second embodiment;

DETAILED DESCRIPTION

A semiconductor device according to an embodiment includes a lower layer wiring and a dummy wiring arranged in a first hierarchy, a contact arranged in a second hierarchy above the first hierarchy and connected to the lower layer wiring, and first and second plate-like portions arranged in the second hierarchy, the first and second plate-like portions extending in a stacking direction of each layer belonging to the second hierarchy and in a first direction intersecting with the stacking direction, and sandwiching the contact in a second direction intersecting with the stacking direction and the first direction at a position away from the contact, and the dummy wiring has at least three edges arranged at respective positions overlapping with one of the first and second plate-like portions in the stacking direction, and an orientation in which at least one of the three edges intersects with the first or second plate-like portion differs as viewed from the stacking direction from orientations in which the other edges intersect with the first or second plate-like portion.

The present invention is now described in detail with reference to the accompanying drawings. Note that the present invention is not limited to an embodiment described below. Besides, the components in the embodiment described below include those that can be easily conceivable to those skilled in the art or substantially the same.

First Embodiment

A first embodiment is now described in detail with reference to the drawings.

(Schematic Configuration of Semiconductor Device)

Figure 1A:
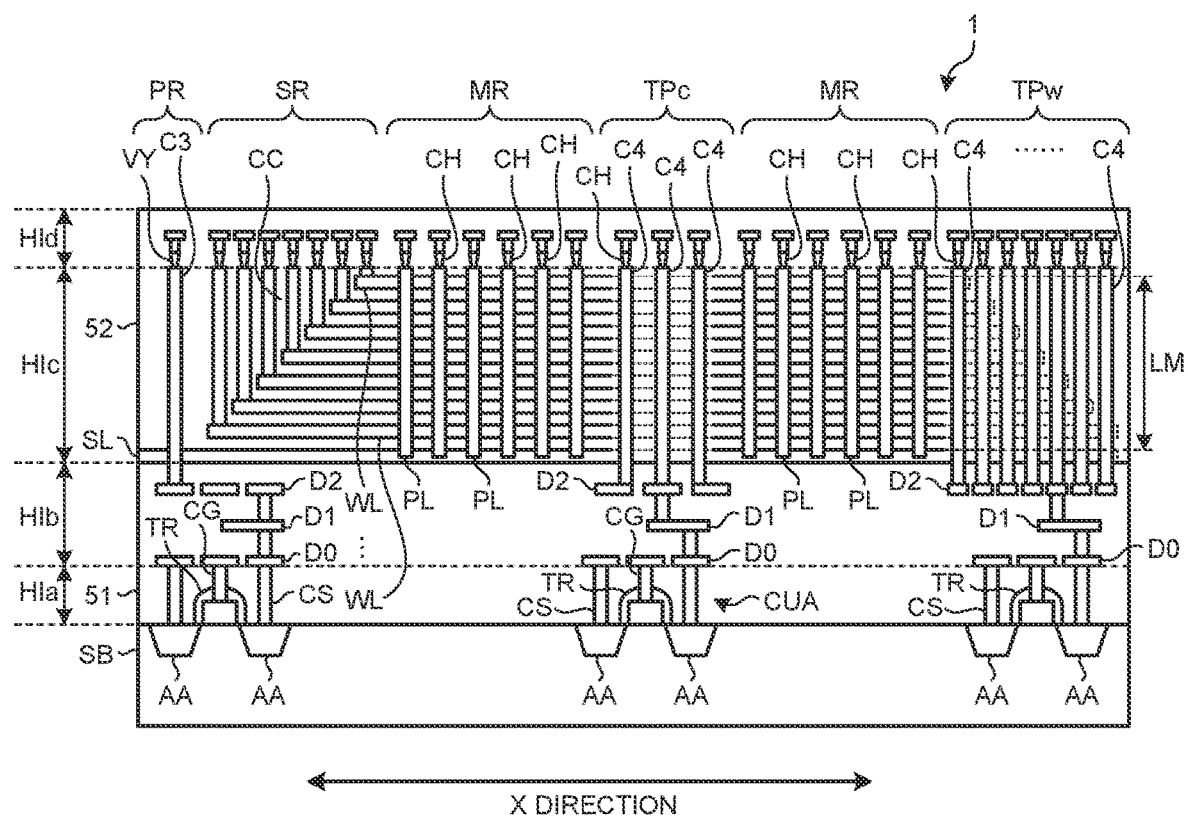
FIGS. 1A to 1C are diagrams illustrating a schematic configuration example of a semiconductor device according to a first embodiment.
Figures 1B, 1C:
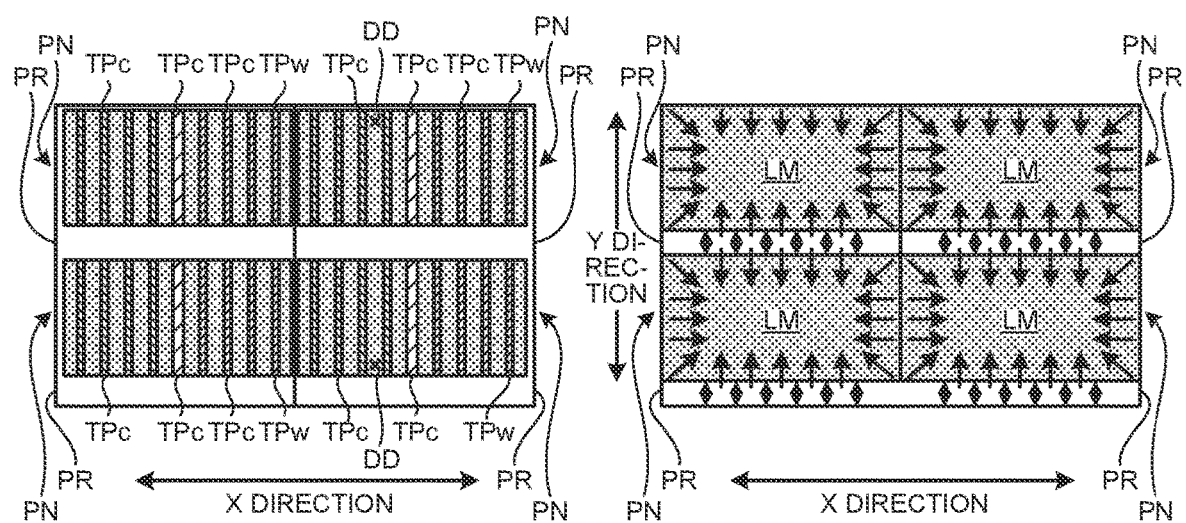

FIGS. 1A to 1C are diagrams illustrating a schematic configuration example of a semiconductor device 1 according to the first embodiment. FIG. 1A is a cross-sectional view of the semiconductor device 1 taken along the X-direction. FIG. 1B is a schematic plan view illustrating the entire semiconductor device 1. FIG. 1C is a schematic plan view illustrating stress that can occur in the semiconductor device 1. However, in FIG. 1A, the cross-hatching is omitted, and some upper layer wirings are omitted in consideration of the visibility of the figure. In addition, structures that do not exist on the same cross-section are also simultaneously illustrated.

Moreover, herein, both X-direction and Y-direction are directions in the plane's orientation of a word line WL described later, and the X-direction and the Y-direction are orthogonal to each other. In addition, the electrical lead-out direction of the word line WL described later can be referred to as a first direction, and the first direction is a direction along the X-direction. In addition, the direction that intersects with the first direction can be referred to as a second direction, and the second direction is a direction along the Y-direction. However, the semiconductor device 1 can involve variation in manufacturing, so the first and second directions are not necessarily orthogonal.

As illustrated in FIG. 1A, the semiconductor device 1 includes a configuration in which a peripheral circuit CUA, a wiring D2, a stacked body LM, an upper layer wiring, and the like are arranged in each of different hierarchies on a substrate SB.

The substrate SB is a semiconductor substrate such as a silicon substrate. The peripheral circuit CUA that includes a transistor TR, an active region AA, contacts CG and CS, or the like is arranged on the substrate SB.

The transistor TR is arranged on the active region AA provided in the substrate SB. The contact CG is connected to the transistor TR, and the contact CS is connected to the active region AA.

The peripheral circuit CUA is arranged below a memory region MR where a plurality of memory cells is arranged, and contributes to the operation of the memory cells, as will be described later.

As described above, the hierarchy on the substrate SB including the peripheral circuit CUA provided with the transistor TR is called a hierarchy HIa.

A plurality of wirings D0 to D2 is electrically connected to the peripheral circuit CUA by, for example, vias or the like, and the plurality of wirings D0 to D2 and the peripheral circuit CUA are covered with an insulating layer 51. The wiring D0 of the plurality of wirings D0 to D2 is connected to, for example, the contacts CG and CS of the peripheral circuit CUA. The wiring D1 is arranged between the wirings D0 and D2, and electrically connects them. The wiring D2 acting as the lower layer wiring is, for example, the uppermost layer wiring of the wirings D0 to D2, and is arranged at a position closest to the stacked body LM. The wirings D0 to D2 are composed of a metal material such as copper or tungsten.

As described above, the hierarchy located above the hierarchy HIa includes the wirings D0 to D2 and is constituted by a part of the insulating layer 51 covering the wirings D0 to D2. Such a hierarchy is called a hierarchy HIb as the first hierarchy.

A source line SL is arranged in a partial region on the insulating layer 51. In addition, the stacked body LM is arranged in a partial region on the insulating layer 51 through the source line SL. A plurality of word lines WL is alternately stacked with a plurality of insulating layers interposed between the word lines WL to form the stacked body LM.

The stacked body LM is provided with the memory region MR, through contact regions TPc and TPw, and a staircase region SR.

The memory region MR is arranged, for example, near the center of the stacked body LM. A plurality of pillars PL is arranged in the memory region MR. The plurality of pillars PL passes through the word lines WL in the stacking direction and reaches the source line SL. A plug CH is arranged at the upper end of the pillar PL. The plug CH connects the pillar PL to the upper layer wiring, such as a bit line. The memory cell is formed at the each intersection of the pillar PL and the word line WL. The application of a predetermined voltage to the memory cell electrically connected to the word line WL or other ways allows data to be read or written from or to the memory cell.

As described above, the semiconductor device 1 is configured as, for example, a three-dimensional non-volatile memory in which memory cells are three-dimensionally arranged in the memory region MR.

The word line WL is terminated in a staircase manner at both ends of the stacked body LM in the X-direction. One end side is the staircase region SR, and the other end side is the through contact region TPw.

The staircase region SR has a configuration in which the plurality of word lines WL is led out in a staircase manner. A contact CC used to connect the word line WL and the upper layer wiring or the like is arranged on each terrace portion of the plurality of word lines WL led out in a staircase manner, enabling a predetermined voltage to be applied to the memory cell through the word line WL.

Moreover, herein, the direction in which the terrace plane of each step of the staircase region SR faces is defined in this specification as the upward direction in the semiconductor device 1.

The through contact region TPw arranged on the other end side of the stacked body LM in the X-direction and the through contact region TPc arranged between the memory regions MR of the stacked body LM include an insulating region having no word line WL.

The word line WL of the stacked body LM is a layer formed by replacing a sacrificial layer composed of an insulating material or the like with a conductive material. Upon replacing materials, blocking materials from replacing in a partial region causes insulating regions such as through contact regions TPw and TPc to be formed. In those insulating regions, a contact C4 used for connecting the peripheral circuit CUA arranged on the lower substrate SB and various upper layer wirings or the like is arranged.

More specifically, the wiring D2 described above, which is electrically connected with the peripheral circuit CUA via a plurality of contacts, vias, wirings, or the like, is connected to the lower end of the contact C4. The plug CH, which is electrically connected with the upper layer wiring or the like, is connected to the upper end of the contact C4.

A peripheral region PR is arranged around the stacked body LM. The peripheral region PR is covered with an insulating layer 52 having a thickness that reaches at least the height of the upper surface of the stacked body LM. Moreover, a contact C3 used for connecting the peripheral circuit CUA and the upper layer wiring or the like can also be arranged in the peripheral region PR.

More specifically, the wiring D2 described above, which is electrically connected with the peripheral circuit CUA via a plurality of contacts, vias, wirings, or the like, is connected to the lower end of the contact C3. The plug VY, which is electrically connected with the upper layer wiring or the like, is connected to the upper end of the contact C3.

As described above, the hierarchy, which is located above the hierarchy HIb and includes the stacked body LM, is called a hierarchy HIc as the second hierarchy. In addition, the hierarchy, which is located above the hierarchy HIc and includes the plug CH, VY, or the like, is called a hierarchy HId. The upper layer wiring connected to the plug CH, VY, or the like can be included in the hierarchy HId.

Further, as described above, the peripheral region PR and the stacked body LM have different configurations, so the stress affecting the stacked body LM from the peripheral region PR occurs between the peripheral region PR and the stacked body LM. Thus, a plane PN of the semiconductor device 1 indicates stress distribution, for example, as illustrated in FIG. 1C.

As illustrated in FIG. 1B, the plane PN includes, for example, at least one stacked body LM and is provided with each configuration belonging to the memory region MR, the staircase region SR, and the through contact regions TPc and TPw among the minimal configurations capable of independently functioning as a storage circuit. The wiring D2 connected to the contact C4 of the through contact regions TPc and TPw can also be included in the plane PN. In the example of FIG. 1B, one plane PN contains one set of the configurations described above. The peripheral region PR having a relatively large area on at least one side in the Y-direction is arranged around the plane PN.

The semiconductor device 1 can include one or more planes PN. In a case where the semiconductor device 1 includes a plurality of planes PN, these planes PN are capable of being operated in parallel. In the example of FIG. 1B, one semiconductor device 1 includes four planes PN. In other words, the region illustrated in FIG. 1B corresponds to one chip cut out as a finished product.

As illustrated in FIG. 1C, the stress can occur between the peripheral region PR and the plane PN due to differences in the materials and structures and the like constituting the peripheral region PR and the plane PN. In one example, in the case where the stacked body LM includes at least a sacrificial layer before replacing with the word line WL, compressive stress occurs toward the center of the stacked body LM as indicated by an inward arrow of FIG. 1C. On the other hand, in the peripheral region PR in which the thick insulating layer 52 is arranged, tensile stress occurs from the center of the peripheral region PR to the outside as indicated by an outward arrow of FIG. 1C.

Due to the influence of such stress, in some cases, deviation in positions from the desired formation position occurs in the various structures illustrated in FIG. 1A described above. In one example, the contact C4 or the like that connects structures between a plurality of different hierarchies can have a faulty connection with one or both of the wiring D2 in the lower layer and the plug CH in the upper layer.

The peripheral region PR adjacent to the plane PN in the Y-direction is more extensive than, for example, the peripheral region PR adjacent to the plane PN in the X-direction. Thus, in some cases, the positional deviation in the contact C4 is more marked in the Y-direction than in the X-direction.

The semiconductor device 1 of the first embodiment includes a dummy wiring DD used for measuring a positional deviation amount of the wiring D2 in the Y-direction, in addition to the various configurations described above. The positional deviation amount of the wiring D2 is herein a positional deviation amount relative to the configuration of the contact C4 or the like arranged in the hierarchy HIc in the upper layer. The influence of the stress described above is more marked in the Y-direction and is more marked at both ends in the Y-direction than at the center of the stacked body LM. Thus, it is preferable that these dummy wirings DD are arranged, for example, near both ends in the Y-direction in one stacked body LM. The detailed configuration of the dummy wiring DD will be described later.

(Detailed Configuration of Semiconductor Device)

Figure 2:
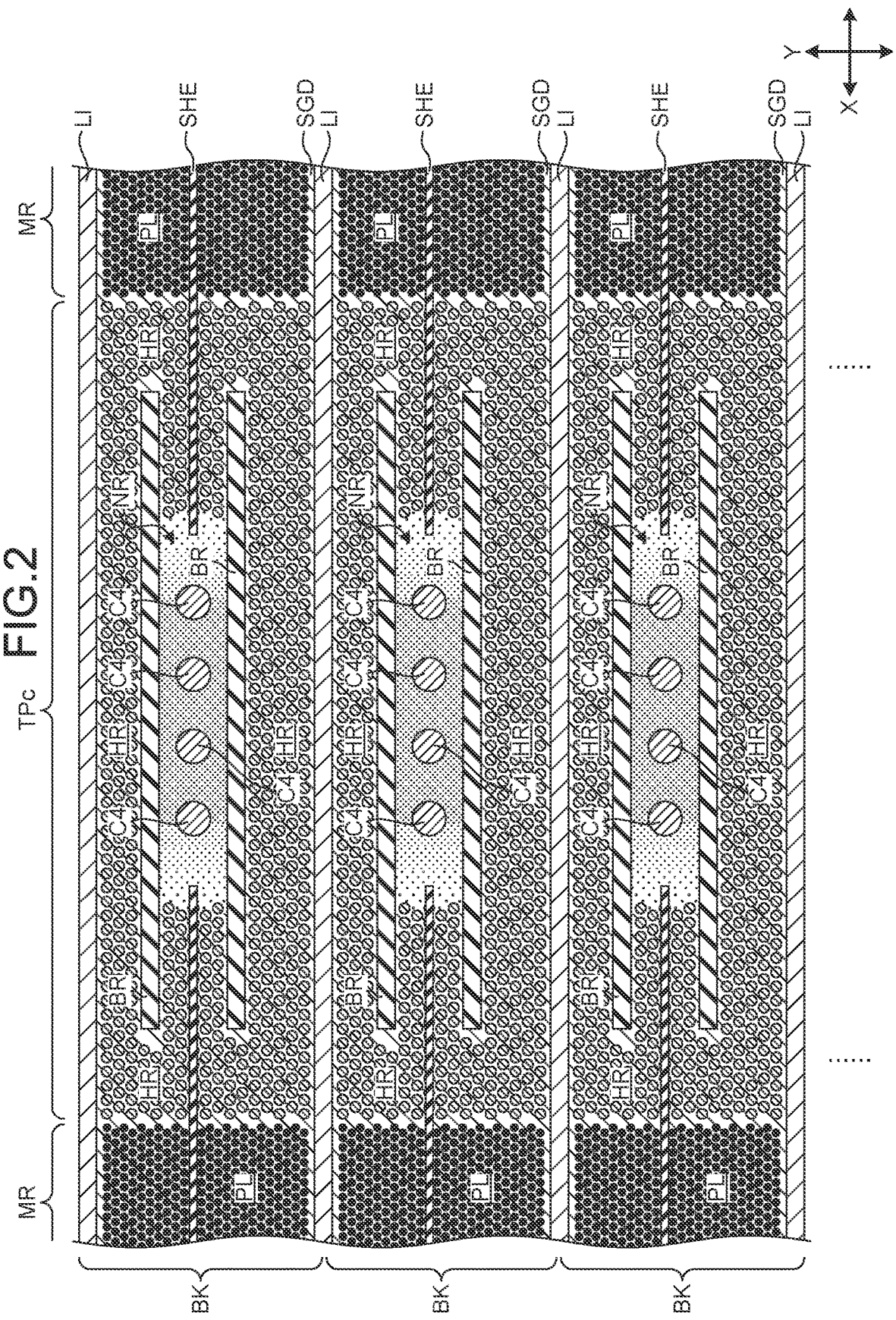
FIG. 2 is a cross-sectional view of a region including a through contact region of the semiconductor device according to the first embodiment.

FIG. 2 is a cross-sectional view of a region including a through contact region TPc of the semiconductor device 1 according to the first embodiment.

As illustrated in FIG. 2, the semiconductor device 1 includes a plurality of contacts LI, which extends in the stacked body LM in the X-direction and is arranged in the Y-direction. The contact LI penetrating through the stacked body LM causes the stacked body LM to be divided in the Y-direction.

In a region sandwiched between the two contacts LI as first and second plate-like portions adjacent to each other in the Y-direction, the following components are arranged. The contact C4, a plate-like portion BR, and a columnar portion HR are arranged in the through contact region TPc, the pillar PL is arranged in the memory region MR, and a separation layer SHE is arranged over the through contact region TPc and the memory region MR. Although not illustrated in FIG. 2, the wiring D2 (see FIG. 1A) connected to the contact C4 is arranged below the contact C4. In addition, the dummy wiring DD (see FIG. 1B) described later is arranged at substantially the same height position of the same hierarchy HIb as the wiring D2.

The contact LI has a longitudinal direction in the direction along the X-direction and has a structure in which a conductive layer having a liner of an insulating layer is filled in a slit that penetrates the stacked body LM and reaches the source line SL. The slit in which the contact LI is formed divides the stacked body LM in the Y-direction. This forms a plurality of regions, which are units of data erasure in the operation of the memory cell called block region BK, in the plane PN of the semiconductor device 1. In the semiconductor device 1 upon the manufacturing, the sacrificial layer of the stacked body LM is removed with removal solution or the like through the slit before filling the conductive layer. In addition, a conductive material gas is supplied into a gap defined by removing the sacrificial layer of the stacked body LM through the slit, forming the word line WL.

Moreover, as described above, the processing of replacing the sacrificial layer with the conductive layer can be called replacement processing.

The conductive layer of the contact LI is connected to the upper layer wiring or the like via the plug CH. The structure connected to the upper layer wiring or the like allows the contact LI to function as, for example, a source line contact in the manufactured semiconductor device 1. However, instead of the contact LI, filling the inside of the slit with an insulating layer or the like can form a plurality of structures as the first and second plate-like portions arranged in the Y-direction, not to be connected with the plug CH and not to function as the source line contact.

The separation layer SHE is arranged between two contacts LI adjacent to each other in the Y-direction. The separation layer SHE separates one or more conductive layers including at least the uppermost conductive layer among the conductive layers formed in the stacked body LM by replacing the sacrificial layer. The separation layer SHE extends in the X-direction and partitions one or more conductive layers of the stacked body LM into a pattern of a selection gate line SGD arranged on both sides of the separation layer SHE in the Y-direction.

In other words, the selection gate line SGD is arranged on the upper layer of the plurality of word lines WL of the stacked body LM. The selection gate line can also be arranged in the lower layer of the plurality of word lines WL of the stacked body LM. Moreover, FIG. 2 illustrates a cross-section of the height position of the selection gate line SGD of the stacked body LM.

A selection gate (not illustrated) is formed at the intersections between the selection gate line SGD in the upper layer and the pillar PL and between the selection gate line in the lower layer and the pillar PL. Turning the selection gate on or off causes the memory cell of the pillar PL to which the selection gate belongs to be the selected state or the unselected state.

The contact C4 has a structure in which a conductive layer having a liner of the insulating layer is filled in a contact hole, which penetrates the stacked body LM and the source line SL and reaches the wiring D2 in the insulating layer 51.

As described above, the contact C4 is arranged in an insulating region NR including the sacrificial layer in which the replacement with the conductive material is blocked. In the example of FIG. 2, the plurality of contacts C4 arranged in the X-direction is arranged in the insulating region NR. However, a plurality of contacts C4 can be arranged in the Y-direction instead of or in addition to the X-direction.

The plate-like portion BR that blocks the replacement of the sacrificial layer with the word line WL or the like is arranged at both ends of the insulating region NR in the Y-direction. The plate-like portion BR has a longitudinal direction in the direction along the X-direction and penetrates the stacked body LM to reach the source line SL. The inside of the plate-like portion BR is filled with an insulating layer.

Such a structure causes the plate-like portion BR to block the inflow of a sacrificial layer removal solution and a conductive material gas from the slit to the insulating region NR upon replacing the sacrificial layer with the word line WL or the like. Thus, the insulating region NR is secured in a region sandwiched between the plate-like portions BR, which is a partial region of the stacked body LM. The arrangement of the contact C4 in the insulating region NR makes it possible to prevent or reduce the occurrence of electrical conduction, for example, between the contact C4 and the word line WL.

The plurality of columnar portions HR is arranged in the through contact region TPc, excluding the insulating region NR. The columnar portion HR penetrates the stacked body LM and reaches the source line SL. The inside of the columnar portion HR is filled with, for example, an insulating layer.

As described above, upon replacing the sacrificial layer with the word line WL or the like, the stacked body LM has a vulnerable structure having a gap between the insulating layers. In this case, the columnar portion HR functions as a support column for supporting the stacked body LM in the through contact region TPc. Moreover, the arrangement of a plurality of the columnar portions HR in the staircase region SR described above can allow the columnar portions HR to function as a support column that supports the staircase region SR. The arrangement of the columnar portion HR can be an orthogonal grid-like (matrix-like) or staggered periodic arrangement, an arrangement in which a part of the above-mentioned periodic arrangement is missing, an arrangement in which the above-mentioned period is partially different, or the like.

As described above, the plurality of pillars PL is arranged in the memory region MR. The memory cells are formed at the intersections of the plurality of pillars PL and the plurality of word lines WL. These pillars PL function as the support columns that support the stacked body LM in the memory region MR upon replacing the sacrificial layer with the word line WL or the like. The array of the pillars PL is, for example, a two-dimensional periodic grid. The staggered arrangement is efficient as an array of pillars PL from the viewpoint of the accumulation density of memory cells.

The configuration described above is formed by, for example, forming a photoresist film or the like having a pattern of each structure on the stacked body LM a plurality of times and repeating the process of transferring the pattern to the stacked body LM. The pattern formation on the photoresist film or the like is performed by, for example, irradiating it with exposure light through a photomask to expose a part of the photoresist film or the like and developing the pattern.

In one example, the contact hole used to form the contact C4 and the slit used to form the contact LI are formed in parallel or in tandem with each other. In other words, in some cases, the contact hole and the slit are collectively etched by using, for example, a pattern formed on the same photoresist film or the like using the same photomask.

Similar to each configuration of the stacked body LM, the wiring D2 below the stacked body LM, the plug CH above the stacked body LM, the upper layer wiring, and the like are also formed by transferring the pattern formed on the photoresist film or the like. In this case, different photomasks are used at different timings from each configuration of the stacked body LM. The dummy wiring DD described later is formed by using, for example, the same photomask, photoresist film, or the like as the wiring D2.

The wiring D2 and the dummy wiring DD are formed using the dual-damascene process or the like in which the wiring D2, the via, and the like are collectively formed. In other words, the wiring D2, the dummy wiring DD, the via, and the like are formed by etching the insulating layer 51 (see FIG. 1A) into a shape in which the wiring D2, the dummy wiring DD, the via, and the like are die-cut and by filling it with a metal material such as copper or tungsten.

(How to Measure Positional Deviation)

Figure 3A:
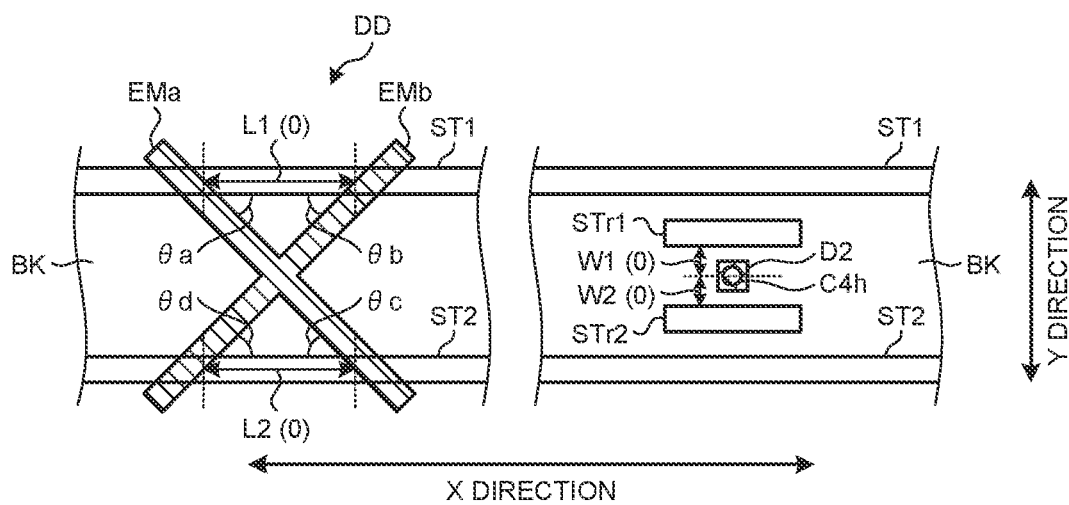
FIGS. 3A and 3B are schematic diagrams illustrated to describe the measurement of a positional deviation amount of a wiring using a dummy wiring provided in the semiconductor device according to the first embodiment.

The description is now given how to measure a positional deviation amount of the wiring D2 in the Y-direction using the dummy wiring DD with reference to FIGS. 3A to 9B. FIGS. 3A and 3B are schematic diagrams illustrated to describe the measurement of a positional deviation amount of the wiring D2 using the dummy wiring DD included in the semiconductor device 1 according to the first embodiment.

Figure 3B:
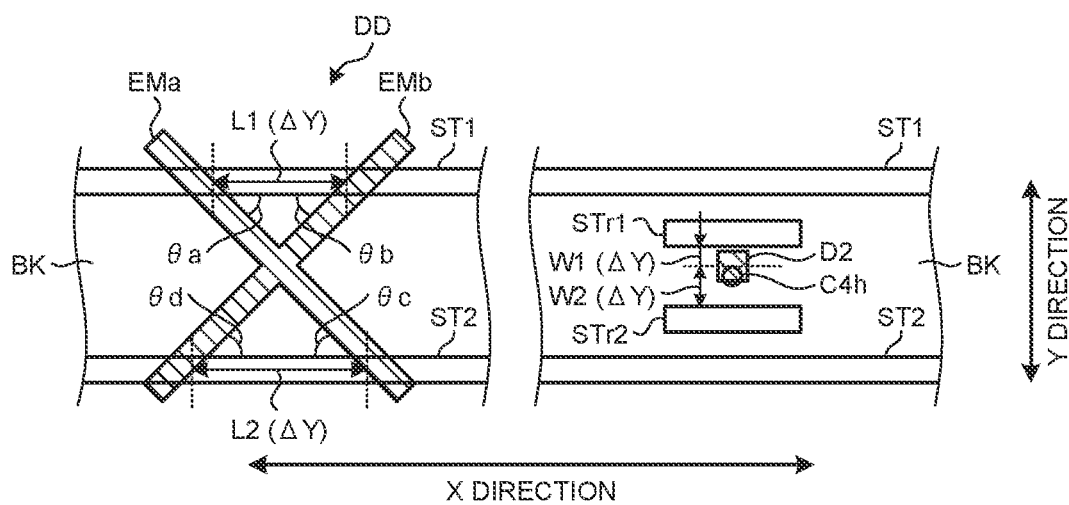

As illustrated in FIGS. 3A and 3B, the positional deviation amount of the wiring D2 in the Y-direction is measured, for example, after forming slits ST1 and ST2 used for replacing the sacrificial layer with the conductive layer. As described above, the dummy wiring DD used for the measurement is formed in parallel with the wiring D2 at the same height position of the same hierarchy HIb as the wiring D2, for example. The slits ST1 and ST2 are formed in the stacked body LM in which a plurality of sacrificial layers and a plurality of insulating layers are alternately stacked after the wiring D2 and the dummy wiring DD are formed.

Due to the influence of various processing steps from the formation of the stacked body LM to the formation of the slits ST1 and ST2, the stacked body LM is likely to be subjected to, for example, compressive stress. In addition, the relative position between the various configurations formed in the stacked body LM and the wiring D2 formed in the lower hierarchy HIb is likely to deviate. In this instance, the relative positional deviation amount between the dummy wiring DD formed near the wiring D2 in parallel with the wiring D2 and the various configurations formed in the stacked body LM is approximately equal to the relative positional deviation amount between the wiring D2 and various configurations of the stacked body LM including the contact C4. Moreover, herein, the relative positional deviation amount between the wiring D2 and the contact C4 or the like is also simply referred to as the positional deviation amount of the wiring D2.

As described below, in the semiconductor device 1 of the first embodiment, the positional deviation amount of the wiring D2 relative to the contact C4 is measured. This measurement is performed by using the dummy wiring DD formed in parallel with the wiring D2 and the slit ST formed in parallel with or in tandem with the contact hole used for forming the contact C4.

The wiring D2 is arranged in a region sandwiched between slits STr1 and STr2 that block the replacement of the sacrificial layer with the conductive layer as viewed from the stacking direction of the stacked body LM. The wiring D2, though drawn in a simplified rectangle in FIGS. 3A and 3B, can have a complicated shape extending in various directions along each layer in the hierarchy HIb.

A contact hole C4h is arranged at a position where the stacked body LM overlaps with the wiring D2 as viewed from the stacking direction. The contact hole C4h is filled with a conductive material or the like and then becomes the contact C4. However, as described later, the contact hole C4h may or may not be formed upon measuring the positional deviation amount of the wiring D2.

On the other hand, the dummy wiring DD is, for example, arranged in a region other than the region, sandwiched between the slits STr1 and STr2, where the wiring D2 is arranged, so as not to influent the electrical characteristics of the wiring D2. Specifically, the dummy wiring DD can be arranged in, for example, the memory region MR, the staircase region SR, or the like.

Further, upon measuring the positional deviation amount of the wiring D2, the dummy wiring DD is observed through the bottom surfaces of the slits ST1 and ST2 using charged particles with an in-line scanning electron microscope (SEM) or the like. Thus, in the region where the dummy wiring DD is arranged, at least the wiring D1 is preferably not arranged in the wiring layer lower than the dummy wiring DD, and it is more preferable that neither the wiring D1 nor the wiring D0 is arranged. This makes it possible to improve the visibility of the dummy wiring DD using the in-line SEM or the like.

Further, the stress received by the stacked body LM is, for example, the weakest near the center of the stacked body LM and becomes stronger toward both ends of the stacked body LM in the Y-direction. Thus, it is preferable that the dummy wiring DD is arranged at least near both ends of the stacked body LM in the Y-direction and in a region satisfying the conditions described above. However, the dummy wiring DD can be arranged in a region other than the vicinity of both ends of the stacked body LM in the Y-direction. It is preferable that a large number of dummy wirings DD is arranged in the stacked body LM at a higher density within the allowable range of the design.

Each of the dummy wirings DD has, for example, a cross shape as viewed from the stacking direction of the stacked body LM and is arranged in one block region BK that is a region between two adjacent slits ST1 and ST2. The four legs of the cross of the dummy wiring DD all overlap with the two ST1 and ST2.

In other words, an element EMa constituting the dummy wiring DD has, for example, a rectangular shape extending obliquely from the upper left to the lower right of the figure. In other words, the element EMa has two edges extending from the upper left to the lower right of the figure and facing each other. The vicinity of the upper left edge of the element EMa on the figure overlaps with the slit ST1 as viewed from the stacking direction of the stacked body LM. The vicinity of the lower right edge of the element EMa on the figure overlaps with the slit ST2 as viewed from the stacking direction of the stacked body LM. The edges of both ends of the element EMa in the X-direction intersect with the slits ST1 and ST2 in a predetermined orientation at a predetermined angle.

An element EMb constituting the dummy wiring DD has, for example, a rectangular shape extending obliquely from the upper right to the lower left of the figure. In other words, the element EMb has two edges extending from the upper right to the lower left of the figure and facing each other. The vicinity of the upper right edge of the element EMb on the figure overlaps with the slit ST1 as viewed from the stacking direction of the stacked body LM. The vicinity of the lower left edge of the element EMb on the figure overlaps with the slit ST2 as viewed from the stacking direction of the stacked body LM. The edges of both ends of the element EMb in the X-direction intersect with the slits ST1 and ST2 in a predetermined orientation at a predetermined angle.

The orientations in which the elements EMa and EMb intersect with the slits ST1 and ST2 differ from each other. In other words, given that the extending directions of the elements EMa and EMb in the block region BK defined by the X-direction and the Y-direction are expressed by the relational expression of X and Y, these are different expressions as shown below.

Extending direction $Y$ of element $EMa = aX + b$

Extending direction $Y$ of element $EMb = cX + d$

In the two formulas above, at least 'a' and 'c' are different values ($a \neq c$). Given that the origins of the X-axis and the Y-axis $(X, Y) = (0, 0)$ are the intersections of the elements EMa and EMb, 'b' and 'd' are zero ($b = d = 0$).

Further, herein, the angle at which the dummy wiring DD intersects with the slits ST1 and ST2 is defined as below.

There are four angles formed by the element EMa of the dummy wiring DD and the slit ST1. Among them, the angle at which the element EMa intersects with the slit ST1 is an angle $\theta a$, which is formed by an edge as a first edge of the element EMa that faces the element EMb in the X-direction and a plane as a first plane of the slit ST1 that faces the slit ST2 in the Y-direction. In addition, there are four angles formed by the element EMa and the slit ST2. Among them, the angle at which the element EMa intersects with the slit ST2 is an angle $\theta c$, which is formed by an edge as a third edge of the element EMa that faces the element EMb in the X-direction and a plane as a second plane of the slit ST2 that faces the slit ST1 in the Y-direction.

On the other hand, there are four angles formed by the element EMb of the dummy wiring DD and the slit ST1. Among them, the angle at which the element EMb intersects with the slit ST1 is an angle θb, which is formed by an edge as a second edge of the element EMb that faces the element EMa in the X-direction and a plane of the slit ST1 that faces the slit ST2 in the Y-direction. In addition, there are four angles formed by the element EMb and the slit ST2. Among them, the angle at which the element EMb intersects with the slit ST2 is an angle θd, which is formed by an edge as a fourth edge of the element EMb that faces the element EMa in the X-direction and a plane of the slit ST2 that faces the slit ST1 in the Y-direction.

In the examples illustrated in FIGS. 3A and 3B, the element EMa and the element EMb are configured so that their slopes relative to the slits ST1 and ST2 are equal but their slope directions are opposite to each other. In other words, the angles θa, θb, θc, and θd are all equal. In this case, the angles θa, θb, θc, and θd can be set to, for example, more than 0° and less than 90°.

FIG. 3A is an example in which the positional deviation amount of the wiring D2 is zero, that is, the wiring D2 is arranged at the design position relative to each configuration of the stacked body LM.

As illustrated in FIG. 3A, if the positional deviation amount of the wiring D2 is zero, the wiring D2 is assumed to be arranged at the center position in the Y-direction between the slits STr1 and STr2 for simplicity of description. In other words, there are a distance W1(0) from the center of gravity of the wiring D2 to the plane of the slit STr1 that faces the slit STr2, and a distance W2(0) from the center of gravity of the wiring D2 to the plane of the slit STr2 that faces the slit STr1. These distances W1(0) and W2(0) are assumed to be equal (W1(0)=W2(0)).

In this case, the center of gravity of the contact hole C4h on the wiring D2 can be arranged, for example, at the center of gravity of the wiring D2.

On the other hand, in the case where the positional deviation amount of the wiring D2 is zero, the dummy wiring DD is designed so that the intersection between the elements EMa and EMb is arranged, for example, at the center position in the Y-direction between the slits ST1 and ST2. Thus, there are a distance L1(0) between a position where the element EMa intersects with the slit ST1 and a position where the element EMb intersects with the slit ST1 and a distance L2(0) between a position where the element EMa intersects with the slit ST2 and a position where the element EMb intersects with the slit ST2. These distances L1(0) and L2(0) are assumed to be equal (L1(0)=L2(0)).

In this regard, in the example of FIG. 3A, for example, the distances between the edges close to each other of the elements EMa and EMb at the center positions in the Y-direction of the slits ST1 and ST2 are the distance L1(0) and the distance L2(0). However, if the measurement is performed on the same part in consistency, the distance between the elements EMa and EMb can be measured at a part other than the same part mentioned above.

In one example, the distance between the elements EMa and EMb can be the distance between the edges far from each other of the elements EMa and EMb. Alternatively, the distance between the elements EMa and EMb can be the distance between the edges on the same side of the elements EMa and EMb in the X-direction, such as the left side or the left side of the figure. In addition, the positions of the slits ST1 and ST2 in the Y-direction can be, for example, the positions of the planes close to each other of the slits ST1 and ST2. Alternatively, the positions of the slits ST1 and ST2 in the Y-direction can be, for example, the positions of the planes far from each other of the slits ST1 and ST2.

The distance between the elements EMa and EMb will be herein referred to as the distance in FIG. 3A described above.

FIG. 3B is an example in which the arrangement position of the wiring D2 deviates in the Y-direction.

In the example of FIG. 3B, suppose the wiring D2 deviates in the upward direction on the figure by a positional deviation amount ΔY relative to each configuration of the stacked body LM. In other words, a distance W1(ΔY) from the center of gravity of the wiring D2 to the plane of the slit STr1 that faces the slit STr2 is less than the distance W2(ΔY) from the center of gravity of the wiring D2 to the plane of the slit STr2 that faces the slit STr1. In addition, suppose the difference between them is ΔY (ΔY=W2 (ΔY)−W1(ΔY)).

In this case, the contact hole C4h on the wiring D2 is arranged, for example, at a position deviating from the center of gravity of the wiring D2, and there is a possibility that the entirety or a part of the bottom surface of the contact hole C4h protrudes from the wiring D2.

On the other hand, in the case where the wiring D2 deviates in position in the Y-direction, in the dummy wiring DD, the intersection of the elements EMa and EMb deviates by a distance equal to the positional deviation amount ΔY of the wiring D2 from the center position in the Y-direction between the slits ST1 and ST2.

Thus, the distance L1(ΔY) between the elements EMa and EMb at the intersection with the slit ST1 is made to be less than the distance L1(0) having no positional deviation (L1(ΔY)<L1(0)). On the other hand, the distance L2(ΔY) between the elements EMa and EMb at the intersection with the slit ST2 is made to be more than the distance L2(0) having no positional deviation (L2(ΔY)>L2(0)).

Furthermore, the distance L1(ΔY) is made to be less than the distance L2(ΔY) (L1(ΔY)<L2(ΔY)). In this case, the smaller the angles θa to θd, the larger the difference between the distance L1(ΔY) and the distance L2(ΔY) relative to the positional deviation amount ΔY, making it possible to amplify the positional deviation amount ΔY for measurement.

In this regard, the distance L1(ΔY) and the distance L2(ΔY) can be expressed by Formulas (1) and (2) below, respectively.

$$L1(\Delta Y)=L1(0)-(\Delta Y/\tan\theta a+\Delta Y/\tan\theta b)=L1(0)-2\Delta Y/\tan\theta a \quad (1)$$

$$L2(\Delta Y)=L2(0)+(\Delta Y/\tan\theta c+\Delta Y/\tan\theta d)=L1(0)+2\Delta Y/\tan\theta a \quad (2)$$

Further, from Formulas (1) and (2), the positional deviation amount ΔY of the wiring D2 can be obtained as shown in Formula (3) below.

$$\Delta Y=\{(L2(\Delta Y)-L1(\Delta Y))/4\}\times\tan\theta a \quad (3)$$

As described above, by arranging the intersection of the element EMa and the element EMb at the center in the Y-direction between the slits ST1 and ST2 upon there is no positional deviation, the distance L1(0) and the distance L2(0) are made to be equal. In addition, by configuring the element EMa and the element EMb so that the slopes relative to the slits ST1 and ST2 are equal and the slope directions are opposite, the values from tan θa to tan θd are made to be equal. Thus, it is possible to obtain the positional deviation amount ΔY by a simple calculation formula, as in Formula (3).

However, the distance L1(0) and the distance L2(0) do not necessarily have to be equal, and the angles θa to θd do not necessarily have to be equal to each other. Even in this case, it is possible to obtain the positional deviation amount ΔY by appropriately modifying Formula (3).

Moreover, if the distance L1(0) upon the positional deviation amount ΔY of zero is known, the measurement of only one of the distance L1(ΔY) and the distance L2(ΔY) and application of the result to either of Formulas (1) and (2) make it possible to obtain the positional deviation amount ΔY theoretically.

However, the distance L1(ΔY) and the distance L2(ΔY) can contain variation such as critical dimension loss upon forming the dummy wiring DD. Thus, measuring both the distance L1(ΔY) and the distance L2(ΔY) and then using Formula (3) allow the positional deviation amount ΔY to be obtained without depending on the design values of the distance L1(0) and the distance L2(0). In other words, the influence of the critical dimension loss or the like that can occur on the dummy wiring DD is reduced, measuring the positional deviation amount ΔY with higher accuracy.

It is possible to construct various variations of the dummy wiring DD illustrated in FIGS. 3A and 3B on the basis of the principles described above.

(Variation of Dummy Wiring)

Some variations of the dummy wiring DD of the semiconductor device 1 according to the first embodiment are now illustrated with reference to FIGS. 4A to 6B. FIGS. 4A to 6B are diagrams schematically illustrating a configuration of the dummy wiring based on how to measure the positional deviation amount in the semiconductor device 1 according to the first embodiment.

Moreover, herein, in some cases, "dummy wiring DD" is used as a general term for dummy wiring including many variations described below. In addition, in some cases, "dummy portion DM" is used as a general term for a dummy portion including many variations.

Figure 4A:
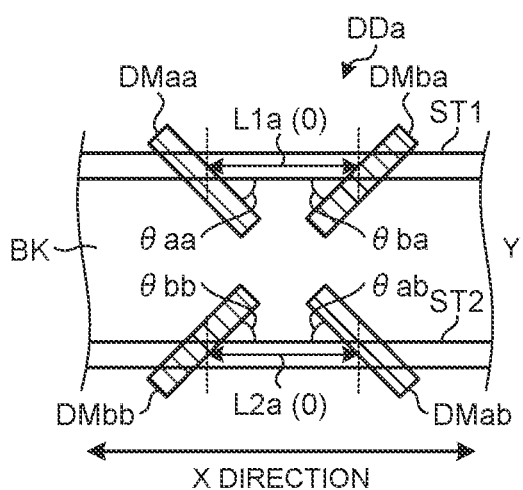
FIGS. 4A and 4B are diagrams schematically illustrating a configuration of the dummy wiring based on how to measure the positional deviation amount in the semiconductor device according to the first embodiment.
Figure 4B:
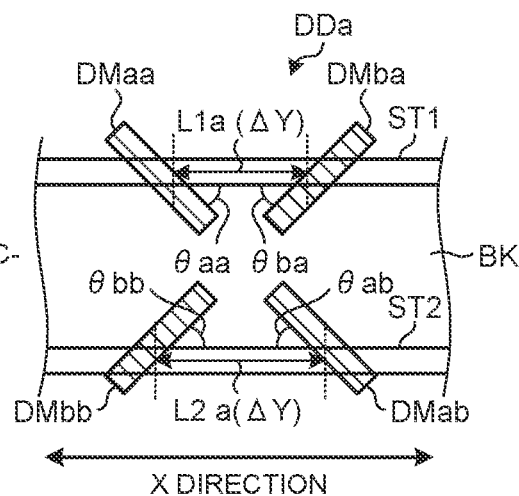

As illustrated in FIGS. 4A and 4B, a dummy wiring DDa preferably includes two or more dummy portions DMaa and DMba overlapping the slit ST1 in the stacking direction and two or more dummy portions DMab and DMbb overlapping the slit ST2 in the stacking direction. These dummy portions DMaa, DMba, DMab and DMbb are preferably separated from each other. The elimination of the above-mentioned configuration that intersects in the cross form facilitates the formation of the dummy portions DMaa, DMba, DMab, and DMbb with ease.

Further, due to the characteristics of the manufacturing process of the semiconductor device 1, upon forming a diagonal pattern, given that the oblique angle is, for example, 45°, it is possible to form the pattern relatively easily and accurately.

Thus, in the example of FIGS. 4A and 4B, an angle θaa formed by the dummy portion DMaa and the slit ST1 and an angle θba formed by the dummy portion DMba and the slit ST1 according to the above definition are approximately 45°. In addition, an angle θab formed by the dummy portion DMab and the slit ST2 and an angle θbb formed by the dummy portion DMbb and the slit ST2 according to the above definition are both approximately 45°. However, the shape of the dummy wiring DDa can contain variation in manufacturing, so these angles θaa, θba, θab, and θbb can vary from 45° to a predetermined range.

The dummy portion DMaa as the first dummy portion is arranged at a position overlapping with the slit ST1 in the stacking direction of the stacked body LM, and has, for example, a rectangular shape extending obliquely from the upper left to the lower right of the figure. In other words, the dummy portion DMaa has two edges extending from the upper left to the lower right of the figure and facing each other. Of these two edges, the edge as the first edge faces the dummy portion DMba. Of the two edges, the edge as the fifth edge is arranged on the side opposite to the side facing the dummy portion DMba in the X-direction.

The dummy portion DMba as the second dummy portion is arranged at a position overlapping with the slit ST1 in the stacking direction of the stacked body LM, and has, for example, a rectangular shape extending obliquely from the upper right to the lower left of the figure. In other words, the dummy portion DMba has two edges extending from the upper right to the lower left of the figure and facing each other. Of these two edges, the edge as the second edge faces the dummy portion DMaa. Of these two edges, the edge as the sixth edge is arranged on the side opposite to the side facing the dummy portion DMaa in the X-direction.

As described above, the angle θaa formed by the dummy portion DMaa and the slit ST1 according to the above definition is, for example, approximately 45°, and the angle θba formed by the dummy portion DMba and the slit ST1 according to the above definition is, for example, approximately 45°. The orientation in which the dummy portion DMaa intersects with the slit ST1 and the orientation in which the dummy portion DMba intersects with the slit ST1 differ from each other.

The dummy portion DMab as the third dummy portion is arranged at a position overlapping with the slit ST2 in the stacking direction of the stacked body LM, and has, for example, a rectangular shape extending obliquely from the upper left to the lower right of the figure. In other words, the dummy portion DMab has two edges extending from the upper left to the lower right of the figure and facing each other. Of these two edges, the edge as the third edge faces the dummy portion DMbb. Of the two edges, the edge as the seventh edge is arranged on the side opposite to the side facing the dummy portion DMbb in the X-direction.

The dummy portion DMbb as the fourth dummy portion is arranged at a position overlapping with the slit ST2 in the stacking direction of the stacked body LM, and has, for example, a rectangular shape extending obliquely from the upper right to the lower left of the figure. In other words, the dummy portion DMbb has two edges extending from the upper right to the lower left of the figure and facing each other. Of these two edges, the edge as the fourth edge faces the dummy portion DMab. Of the two edges, the edge as the eighth edge is arranged on the side opposite to the side facing the dummy portion DMab in the X-direction.

As described above, the angle θab formed by the dummy portion DMab and the slit ST2 according to the above definition is, for example, approximately 45°, and the angle θbb formed by the dummy portion DMbb and the slit ST2 according to the above definition is, for example, approximately 45°. The orientation in which the dummy portion DMab intersects with the slit ST2 and the orientation in which the dummy portion DMbb intersects with the slit ST2 differ from each other.

As illustrated in FIG. 4A, in the case where the wiring D2 is arranged without any positional deviation amount in the Y-direction relative to each configuration of the stacked body LM, the dummy portions DMaa and DMba at the intersection with the slit ST1 are arranged, for example, by a distance L1a(0) apart from each other. The dummy portions DMab and DMbb at the intersection with the slit ST2 are arranged, for example, by a distance L2a(0) apart from each other. The distance L1a(0) and the distance L2a(0) may or may not be equal.

As illustrated in FIG. 4B, there is a case where the wiring D2 is arranged by deviating by a positional deviation amount ΔY in the upper direction on the figure relative to each configuration of the stacked body LM. In this case, the dummy portions DMaa and DMba at the intersection position with the slit ST1 are arranged, for example, by a distance L1a(ΔY) apart from each other, and the dummy portions DMab and DMbb at the intersection with the slit ST2 are arranged, for example, by a distance L2a(ΔY) apart from each other. In this case, the distance L1a(ΔY) is shorter than the distance L1a(0), and the distance L2a(ΔY) is longer than the distance L2a(0).

As described above, it is possible to calculate the positional deviation amount ΔY of the wiring D2 relative to each configuration of the stacked body LM using a technique similar to the case of using the dummy wiring DD illustrated in FIGS. 3A and 3B described above.

Moreover, the angles θaa, θba, θab, and θbb are, for example, 45°, so it can be seen that the positional deviation amount ΔY is amplified four times in the positional deviation amount measurement using the dummy wiring DDa from Formula (3) mentioned above.

Figure 5A:
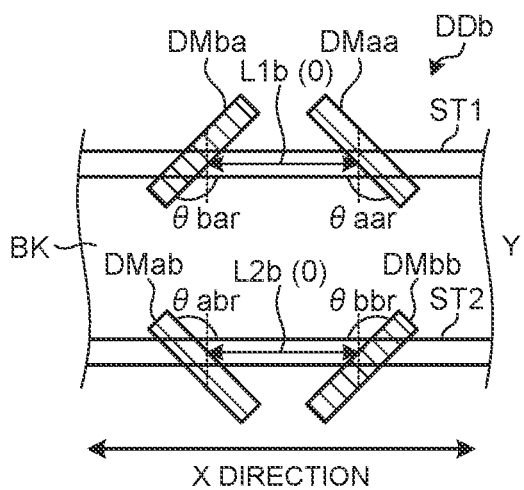
FIGS. 5A and 5B are diagrams schematically illustrating a configuration of the dummy wiring based on how to measure the positional deviation amount in the semiconductor device according to the first embodiment.
Figure 5B:
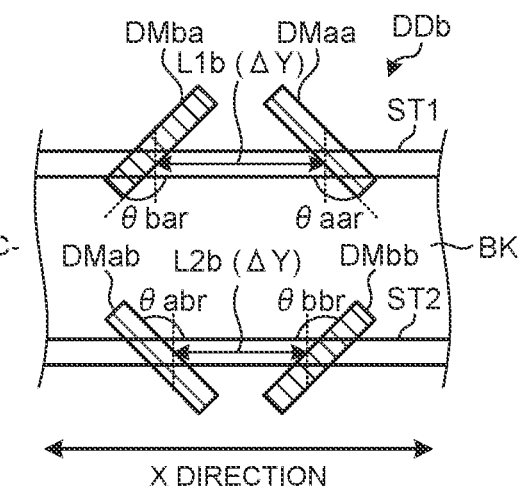

As illustrated in FIGS. 5A and 5B, a dummy wiring DDb also includes two or more dummy portions DMaa and DMba overlapping the slit ST1 in the stacking direction and two or more dummy portions DMab and DMbb overlapping the slit ST2 in the stacking direction. However, the arrangement of the dummy portions DMaa and DMba in the X-direction is interchanged, and the arrangement of the dummy portions DMab and DMbb in the X-direction is interchanged.

Thus, the angle θaar formed by the dummy portion DMaa and the slit ST1 according to the above definition is, for example, approximately 135°, and the angle θbar formed by the dummy portion DMba and the slit ST1 according to the above definition is, for example, approximately 135°. Also in this case, the orientation in which the dummy portion DMaa intersects with the slit ST1 and the orientation in which the dummy portion DMba intersects with the slit ST1 differ from each other.

Further, the angle θabr formed by the dummy portion DMab and the slit ST2 according to the above definition is, for example, approximately 135°, and the angle θbbr formed by the dummy portion DMbb and the slit ST2 according to the above definition is, for example, approximately 135°. Also in this case, the orientation in which the dummy portion DMab intersects with the slit ST2 and the orientation in which the dummy portion DMbb intersects with the slit ST2 differ from each other.

As illustrated in FIG. 5A, in the case where the wiring D2 is arranged without any positional deviation amount in the Y-direction relative to each configuration of the stacked body LM, the dummy portions DMaa and DMba at the intersection with the slit ST1 are arranged, for example, by a distance L1b(0) apart from each other. The dummy portions DMab and DMbb at the intersection with the slit ST2 are arranged, for example, by a distance L2b(0) apart from each other. The distance L1b(0) and the distance L2b(0) may or may not be equal.

As illustrated in FIG. 5B, there is a case where the wiring D2 is arranged by deviating by a positional deviation amount ΔY in the upper direction on the figure relative to each configuration of the stacked body LM. In this case, the dummy portions DMaa and DMba at the intersection position with the slit ST1 are arranged, for example, by a distance L1b(ΔY) apart from each other, and the dummy portions DMab and DMbb at the intersection with the slit ST2 are arranged, for example, by a distance L2b(ΔY) apart from each other. In this case, the distance L1b(ΔY) is longer than the distance L1b(0), and the distance L2b(ΔY) is shorter than the distance L2b(0).

Even in the case of using the dummy wiring DDb having the above configuration as described above, it is possible to calculate the positional deviation amount ΔY of the wiring D2 relative to each configuration of the stacked body LM using the technique similar to the case of using the dummy wiring DD illustrated in FIGS. 3A and 3B.

Moreover, the angles θaar, θbar, θabr, and θbbr are, for example, 135°, so it can be seen that the positional deviation amount ΔY is amplified four times in the positional deviation amount measurement using the dummy wiring DDb from Formula (3) mentioned above, too.

Moreover, at least some of the plurality of dummy portions DMaa, DMba, DMab and DMbb arranged at positions overlapping the slits ST1 and ST2 can have different angles at which they intersect with the slits ST1 and ST2.

Figure 6A:
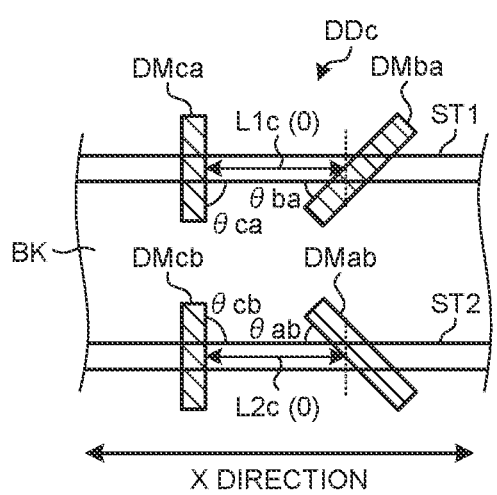
FIGS. 6A and 6B are diagrams schematically illustrating a configuration of the dummy wiring based on how to measure the positional deviation amount in the semiconductor device according to the first embodiment.
Figure 6B:
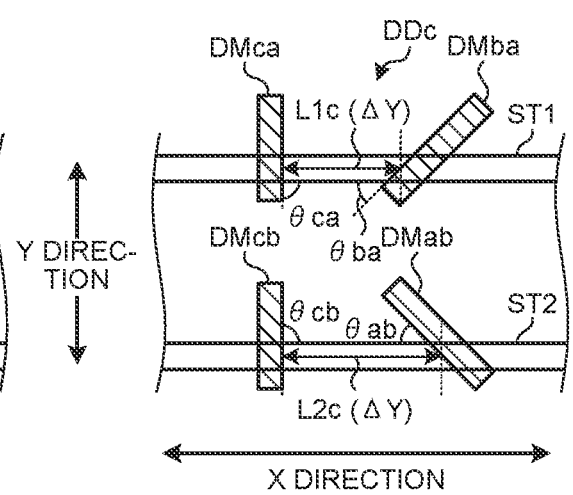

As illustrated in FIGS. 6A and 6B, a dummy wiring DDc includes two or more dummy portions DMba and DMca overlapping the slit ST1 in the stacking direction and two or more dummy portions DMab and DMcb overlapping the slit ST2 in the stacking direction. Angles θca and θcb of the respective dummy portions DMca and DMcb are, for example, equal to each other, and are different from angles θba and θab of the respective dummy portions DMba and DMab.

Due to the characteristics of the manufacturing process of the semiconductor device 1, it is possible to form a pattern having an edge along the X-direction and a pattern having an edge along the Y-direction more easily and accurately.

Thus, in the examples of FIGS. 6A and 6B, the angle θca formed by the dummy portion DMca and the slit ST1 according to the above definition and the angle θcb formed by the dummy portion DMcb and the slit ST2 according to the above definition are approximately 90°. In other words, the dummy portion DMca is substantially orthogonal to the slit ST1, and the dummy portion DMcb is substantially orthogonal to the slit ST2. However, the shape of the dummy wiring DDc can contain variation in manufacturing, so these angles θca and θcb can also vary from 90° to a predetermined range.

Moreover, the dummy portions DMba and DMab of the dummy wiring DDc have a similar configuration to the respective dummy portions DMba and DMab of the dummy wiring DDa of FIGS. 4A and 4B described above.

The dummy portion DMca as the first dummy portion is arranged at a position overlapping with the slit ST1 in the stacking direction of the stacked body LM, and has, for example, a rectangular shape extending in the direction along the Y-direction. In other words, the dummy portion DMca has two edges extending in the direction along the Y-direction and facing each other. Of these two edges, the edge as the first edge faces the dummy portion DMba. Of the two edges, the edge as the fifth edge is arranged on the side opposite to the side facing the dummy portion DMba in the X-direction.

As described above, the angle θba formed by the dummy portion DMba and the slit ST1 according to the above definition is, for example, approximately 45°, and the angle θca formed by the dummy portion DMca and the slit ST1 according to the above definition is, for example, approximately 90°. Thus, the orientations in which the dummy portions DMba and DMca intersect with the slit ST1 differ from each other.

The dummy portion DMcb as the third dummy portion is arranged at a position overlapping with the slit ST2 in the stacking direction of the stacked body LM, and has, for example, a rectangular shape extending in the direction along the Y-direction. In other words, the dummy portion DMcb has two edges extending in the direction along the Y-direction and facing each other. Of these two edges, the edge as the third edge faces the dummy portion DMab. Of the two edges, the edge as the seventh edge is arranged on the side opposite to the side facing the dummy portion DMab in the X-direction.

As described above, the angle θab formed by the dummy portion DMab and the slit ST2 according to the above definition is, for example, approximately 45°, and the angle θcb formed by the dummy portion DMcb and the slit ST2 according to the above definition is, for example, approximately 90°. Thus, the orientations in which the dummy portions DMab and DMcb intersect with the slit ST2 differ from each other.

As illustrated in FIG. 6A, in the case where the wiring D2 is arranged without any positional deviation amount in the Y-direction relative to each configuration of the stacked body LM, the dummy portions DMba and DMca at the intersection with the slit ST1 are arranged, for example, by a distance L1$c$(0) apart from each other. The dummy portions DMab and DMcb at the intersection with the slit ST2 are arranged, for example, by a distance L2$c$(0) apart from each other. The distance L1$c$(0) and the distance L2$c$(0) may or may not be equal.

As illustrated in FIG. 6B, there is a case where the wiring D2 is arranged by deviating by a positional deviation amount ΔY in the upper direction on the figure relative to each configuration of the stacked body LM. In this case, the dummy portions DMba and DMca at the intersection position with the slit ST1 are arranged, for example, by a distance L1$c$(ΔY) apart from each other, and the dummy portions DMab and DMcb at the intersection with the slit ST2 are arranged, for example, by a distance L2$c$(ΔY) apart from each other. In this case, the distance L1$c$(ΔY) is shorter than the distance L1$c$(0), and the distance L2$c$(ΔY) is longer than the distance L2$c$(0).

Even in the case of using the dummy wiring DDc having the above configuration as described above, it is possible to calculate the positional deviation amount ΔY of the wiring D2 relative to each configuration of the stacked body LM using the technique similar to the case of using the dummy wiring DD illustrated in FIGS. 3A and 3B.

Moreover, the angles θba and θab are, for example, 450 and the angles θca and θcb are, for example, 90°. Thus, it can be seen that the positional deviation amount ΔY is amplified double in the positional deviation amount measurement using the dummy wiring DDc by modifying Formula (3) above.

Further, the arrangement of the dummy portions DMba and DMca in the X-direction of the dummy wiring DDc in FIGS. 6A and 6B, and the arrangement of the dummy portions DMab and DMcb in the X-direction of the dummy wiring DDc in FIGS. 6A and 6B, can be interchanged. This is similar to the configuration of the dummy wiring DDb in FIGS. 5A and 5B obtained by modifying the configuration of the dummy wiring DDa in FIGS. 4A and 4B. Thus, in the case where the angles of the dummy portions DMca and DMcb according to the above definition are, for example, approximately 90°, the angles of the dummy portions DMba and DMab according to the above definition can have a value of more than 0° and less than 180°, excluding 90°.

As seen above, in the case where positional deviation occurs in the wiring D2 in the Y-direction, of the distance between two dummy portions DM intersecting with the slit ST1 and the distance between two dummy portions DM intersecting with the slit ST2, one is made to increase, and the other is made to decrease. Thus, it is possible to measure the positional deviation amount of the wiring D2 using the technique illustrated in FIGS. 3A and 3B.

In this case, the orientation of intersection with the slit ST1 or the slit ST2 can be different from each other in the entirety or a part of the dummy portions DM included in the dummy wiring DD. In this instance, the relational expressions with X and Y representing the extending directions of the respective dummy portions DM are different from each other. In addition, the entirety or a part of the angles of these dummy portions DM intersecting with the slits ST1 and ST2 according to the above definition can be different.

Thus, there is a case where the angles of two dummy portions DM intersecting with the slit ST1 according to the above definition are more than 0° and 90° or less. In this case, it is possible to configure the dummy wiring DD so that the angles of two dummy portions DM intersecting with the slit ST2 according to the above definition are more than 0° and 90° or less.

There is a case where the angles of two dummy portions DM intersecting with the slit ST1 according to the above definition are 90° or more and less than 180°. In this case, it is possible to configure the dummy wiring DD so that the angles of two dummy portions DM intersecting with the slit ST2 according to the above definition are 90° or less and less than 180°.

In any cases described above, the angles of the plurality of dummy portions DM according to the above definition can have the same value or different values from each other in at least a part of the plurality of dummy portions DM in the range of more than 0° and less than 180°.

Further, it is possible to configure the dummy wiring DD so that an intersection of edges of two dummy portions DM that intersect with the slit ST1 or an intersection between their extension lines, and an intersection of edges of two dummy portions DM that intersect with the slit ST2 or an intersection between their extension lines are both located inside or outside the region sandwiched between the slits ST1 and ST2.

In one example, in the dummy wiring DDa of FIGS. 4A and 4B, the intersection between the extension lines of the dummy portions DMaa and DMba and the intersection between the extension lines of the dummy portions DMab and DMbb are both located inside the region sandwiched between the slits ST1 and ST2.

Further, in one example, in the dummy wiring DDb of FIGS. 5A and 5B, the intersection between the extension lines of the dummy portions DMaa and DMba and the intersection between the extension lines of the dummy portions DMab and DMbb are both located outside the region sandwiched between the slits ST1 and ST2.

(Method of Manufacturing Semiconductor Device 1)

The semiconductor device 1 of the first embodiment can be manufactured by several different methods. FIGS. 7 to 9B are flowcharts schematically illustrating some variations of the method of manufacturing the semiconductor device 1 according to the first embodiment.

An example of the method of manufacturing the semiconductor device 1 of the first embodiment is now described with reference to FIG. 7. Note that the following reference numerals are mainly cited from FIGS. 1A and 2.

Figure 7:
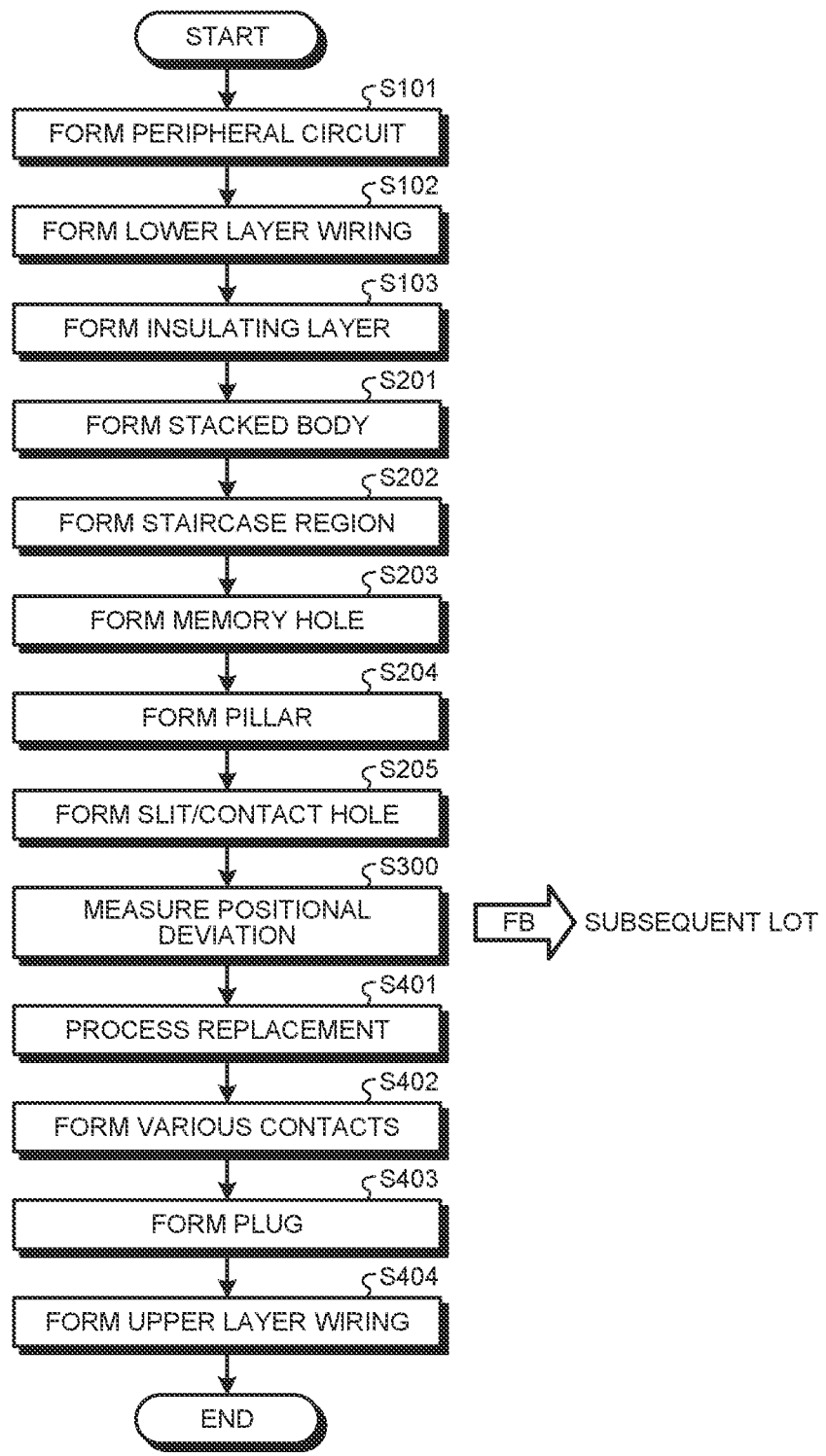
FIG. 7 is a flowchart exemplarily illustrating some variations of the method for manufacturing the semiconductor device according to the first embodiment.

As illustrated in FIG. 7, the peripheral circuit CUA, which includes the transistor TR and various contacts CG and CS, is formed on the substrate SB (step S101). Accordingly, various configurations in the hierarchy HIa are formed.

Various wirings including the wiring D2 as a lower layer wiring are formed (step S102). In addition, the insulating layer 51 that covers these configurations is formed (step S103). Accordingly, various configurations in the hierarchy HIb are formed. Then, various configurations are started to be formed in the hierarchy HIc.

The stacked body LM is formed on the insulating layer 51 via the source line SL (step S201). In this instance, the stacked body LM includes the sacrificial layer before it is replaced with the conductive layer. In addition, the staircase region SR is formed in the stacked body LM (step S202).

A memory hole used to form the pillar PL is formed in the stacked body LM (step S203). A memory layer capable of storing data, a channel layer, and the like are formed in the memory hole to form the pillar PL (step S204).

Moreover, in one example, due to the influence of the processing steps so far in the hierarchy HIc, in some cases, the relative position of the stacked body LM deviates relative to the formed wiring D2. Specifically, the positional deviation can occur due to the influence of the formation of the staircase region SR in addition to the stacked body LM itself of a stacked structure including the sacrificial layer, which contains stress.

Further, upon forming a memory layer, a channel layer, or the like in the memory hole, in some cases, a thermal history is received, or annealing is performed to flatten the stacked structure including the stacked body LM. The stacked body LM can also be subjected to stress deformation by such thermal treatment.

Then, the slit ST used for the replacement processing, the contact hole used to form the contact C4, and the like are formed in parallel (step S205). In this way, the slit ST and the contact hole are formed together, so, in principle, there is no positional deviation between the slit ST and the contact hole. In one example, there is no positional deviation between the slit ST used to measure the positional deviation of the wiring D2 and the contact hole to be aligned with the wiring D2, so it is possible to measure the positional deviation of the wiring D2 with high accuracy.

Moreover, in the processing of step S205 described above, the slits STr (see FIGS. 3A and 3B) that block the replacement processing can be formed in parallel.

The dummy wiring DD is observed from an opening of the slit ST by an in-line SEM using charged particles or the like, and the distance between the predetermined dummy portions DM is measured. Then, the positional deviation amount of the wiring D2 relative to the various configurations of the stacked body LM is calculated using Formula (3) above or the like (step S300). The source line SL (see FIG. 1A) is interposed at the bottom of the slit ST, and the dummy wiring DD is covered with the insulating layer 51. However, the irradiation with the charged particles makes it possible to pass through the bottom of the slit ST to observe the dummy wiring DD.

Moreover, the current lot including the substrate to be measured is evaluated on the basis of the measurement result obtained in this step. In this instance, in the case where the positional deviation amount of the wiring D2 exceeding a predetermined value is measured, a defective product is determined in units of block BK, plane PN, or chip. In addition, the measurement result obtained in this step is fed back to the subsequent lot, and for example, the positional deviation of the wiring D2 in the subsequent lot is corrected.

Then, the replacement processing for the stacked body LM is performed (step S401). In addition, the slit ST and the contact hole are filled with the conductive layer to form the contacts LI and C4, and the contact CC is formed in the staircase region SR (step S402). In addition, the plug CH or the like connected to various contacts LI, C4, and CC is formed (step S403), and the upper layer wiring is further formed (step S404).

As described above, the semiconductor device 1 of the first embodiment is manufactured.

(Method 2 of Manufacturing Semiconductor Device)

Upon manufacturing the semiconductor device 1, in some cases, the stacked body LM is formed by dividing it into a plurality of stages. An example in which the semiconductor device 1 is manufactured by forming a two-stage (2-Tier) stacked body LM is now described with reference to FIG. 8.

As illustrated in FIG. 8, the processing of steps S101 to S103 is similar to the processing of FIG. 7 described above.

A stacked body LM of the first stage (1-Tier) is formed (step S211). In this case, the stacked body LM of the first stage includes a sacrificial layer before being replaced with the conductive layer.

A substructure of the staircase region SR is formed on the stacked body LM of the first stage (step S212). A memory hole used for forming the substructure of the pillar PL is formed in the stacked body LM of the first stage (step S213).

A stacked body LM of the second stage (2-Tier) is formed (step S221). In this case, the stacked body LM of the second stage includes the sacrificial layer before being replaced with the conductive layer together with the stacked body LM of the first stage. Moreover, upon forming the stacked body LM of the second stage, the memory hole formed in the stacked body LM of the first stage is filled with the sacrificial layer or the like.

A superstructure of the staircase region SR is formed in the stacked body LM of the second stage (step S222). A memory hole used for forming the superstructure of the pillar PL is formed in the stacked body LM of the second stage (step S223). The sacrificial layer or the like is removed from the memory hole corresponding to the substructure. Then, a memory layer, a channel layer, and the like capable of storing data are formed in the memory hole, forming the pillar PL (step S224).

Subsequently, the slit ST used for the replacement processing, the slit STr that blocks the replacement processing, the contact hole used for forming the contact C4, and the like are formed, similarly to the process of step S205 described above (step S225).

The dummy wiring DD is observed from the opening of the slit ST, the distance between the predetermined dummy portions DM is measured, and the positional deviation amount of the wiring D2 is calculated (step S300), similarly to the processing of step S300 in FIG. 7 described above. The measurement result is fed back to the subsequent lot or the like.

The processing of steps S401 to S404 is similar to the processing of FIG. 7 described above.

As described above, the semiconductor device 1 of the first embodiment is manufactured by a method different from that of FIG. 7 described above.

(Method 3 of Manufacturing Semiconductor Device)

Upon manufacturing the semiconductor device 1, in some cases, the slit ST used for the replacement processing and the contact hole used for forming the contact C4 are formed in separate processing steps. Examples of a case where the contact hole is formed prior to the slit ST in FIG. 9A and a case where the slit ST is formed prior to the contact hole in FIG. 9B are now described.

As illustrated in FIGS. 9A and 9B, the processing of steps S101 to S103, S211 to S213, and S221 to S224 is similar to the processing of FIG. 8 described above.

As illustrated in FIG. 9A, the contact hole is first formed (step S236), and then the slit ST is formed (step S237). The slit STr that blocks the replacement can be formed in parallel with the slit ST.

As described above, the contact hole and the slit ST are formed in separate processing steps, so positional deviation can occur between these configurations. The positional deviation between the contact hole and the slit ST is mainly due to the fact that they are processed using different photoresist films. In other words, upon forming the photoresist film on the stacked body LM a plurality of times, misalignment can occur in each case.

However, the formation of the contact hole and the formation of the slit ST are carried out in close proximity to each other, so it is unlikely that a step of causing the deviation in position due to stress is intervened between them.

Further, the contact hole and the slit ST are formed on the same hierarchy HIc, so it is possible to measure the positional deviation between them relatively easily. It is possible to maintain the accuracy of the positional deviation measurement of the wiring D2 by adding the positional deviation measurement result between the contact hole and the slit ST to the positional deviation measurement result of the wiring D2 using the dummy wiring DD to be carried out.

After the formation of the slit ST, the dummy wiring DD is observed from the opening of the slit ST, the distance between the predetermined dummy portions DM is measured, and the positional deviation amount of the wiring D2 is calculated (step S300), similarly to the processing of step S300 in FIG. 7 described above.

The processing of steps S401 to S404 is similar to the processing of FIG. 7 described above.

In the procedure illustrated in FIG. 9B, the slit ST is first formed (step S238). The slit STr that blocks the replacement processing can be formed in parallel with the slit ST.

After the formation of the slit ST and before the formation of the contact hole, the dummy wiring DD is observed from the opening of the slit ST, the distance between the predetermined dummy portions DM is measured, and the positional deviation amount of the wiring D2 is calculated (step S300), similarly to the processing of step S300 in FIG. 7 described above.

As described above, in the procedure of FIG. 9B, it is possible to obtain the measurement result of the positional deviation amount of the wiring D2 before the contact hole is formed. Thus, similar to the procedures of FIGS. 8 and 9A, the measurement result is fed back to the subsequent lot, and the measurement result of the positional deviation amount can be fed back to the substrate to be measured for the positional deviation and other substrates of the current lot. This makes it possible to feedback the measurement result immediately, correcting the positional deviation.

As described above, for example, the contact hole is formed while feeding back the measurement result (step S301).

The processing of steps S401 to S404 is similar to the processing of FIG. 7 described above.

As described above, the semiconductor device 1 of the first embodiment is manufactured by a method different from that of FIG. 8 described above.

First Application Example of Dummy Wiring

Figure 10:
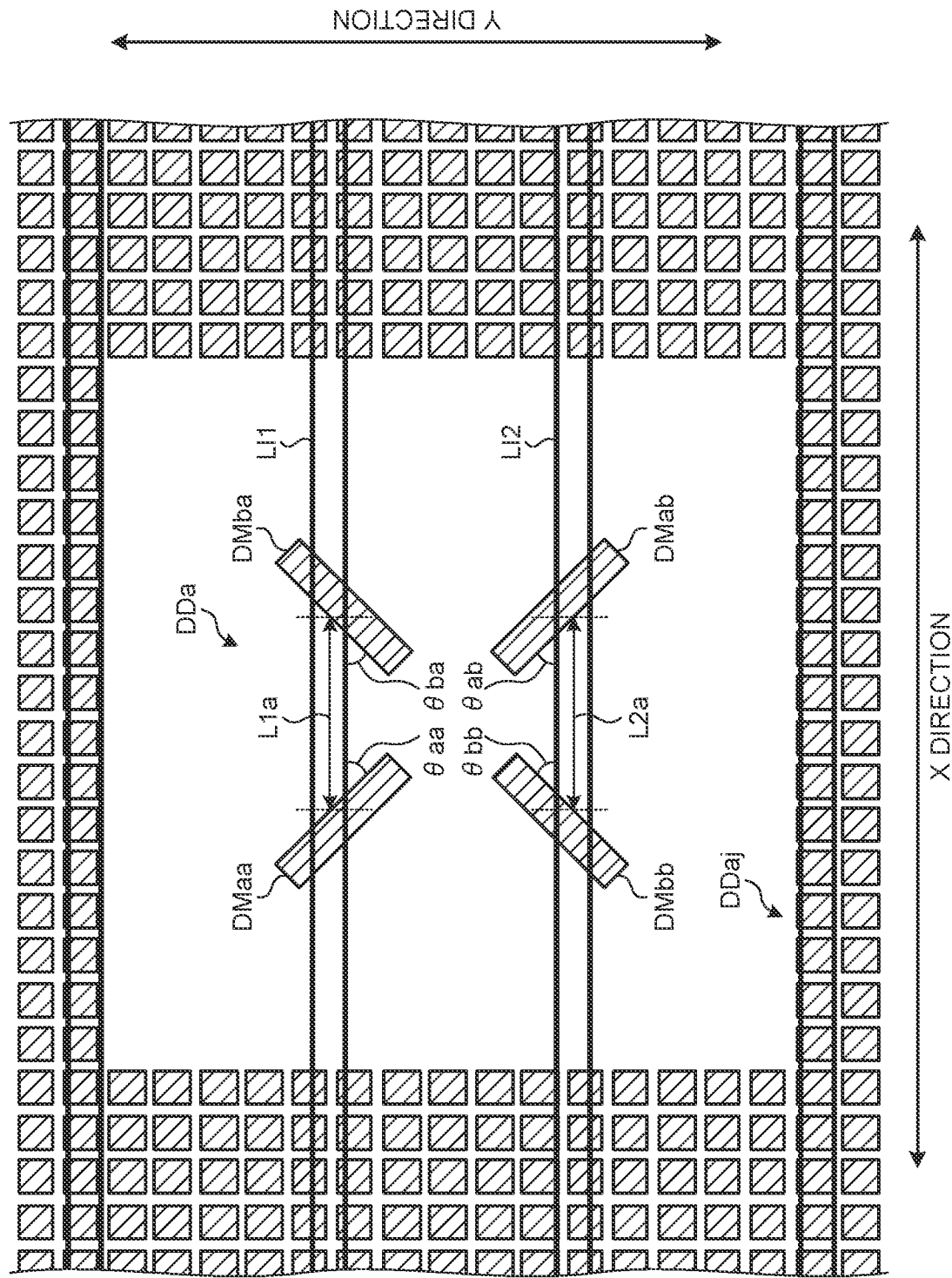
FIG. 10 is a diagram illustrating an example of application of the dummy wiring to the semiconductor device according to the first embodiment.
Figure 11:
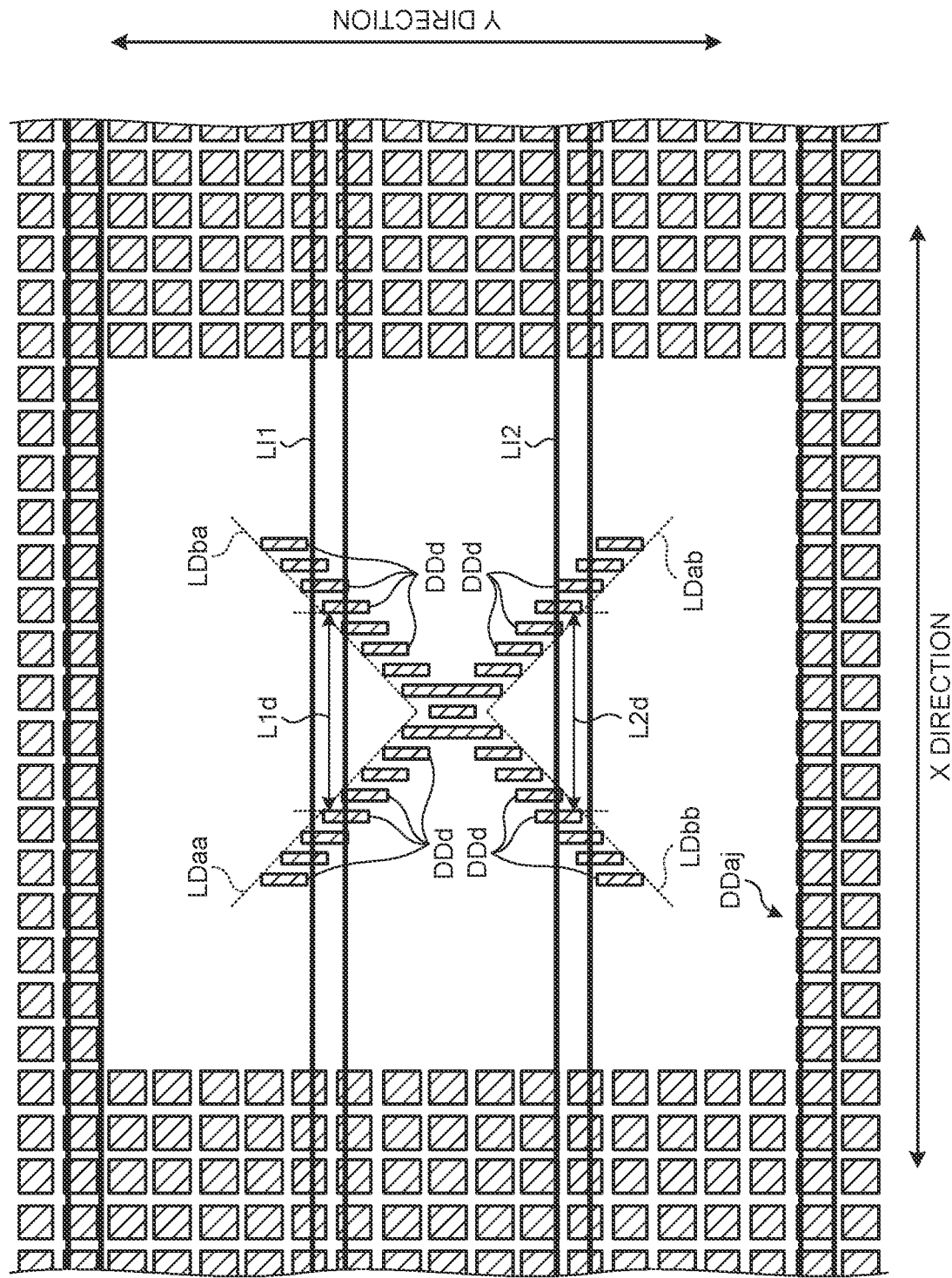
FIG. 11 is a diagram illustrating an example of application of the dummy wiring to the semiconductor device according to the first embodiment.
Figure 12:
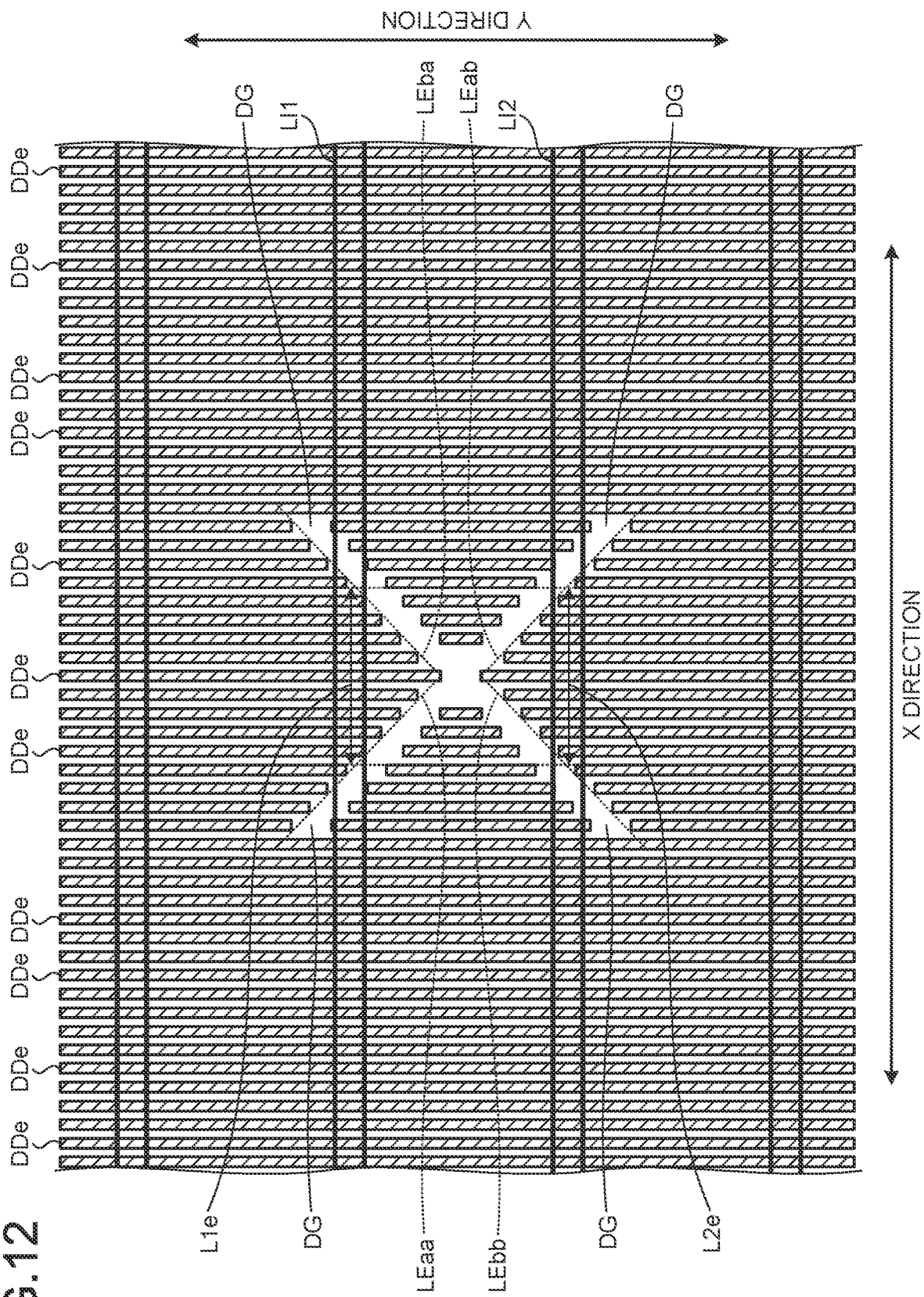
FIG. 12 is a diagram illustrating an example of application of the dummy wiring to the semiconductor device according to the first embodiment.

Some examples of applying the various dummy wirings DD as described above to the semiconductor device 1 of the first embodiment are now described. FIGS. 10 to 12 are diagrams schematically illustrating an application of the dummy wiring DD to the semiconductor device 1 according to the first embodiment.

An example in which the dummy wiring DDa of FIGS. 4A and 4B described above is applied to the semiconductor device 1 of the first embodiment is first described with reference to FIG. 10.

As illustrated in FIG. 10, at a predetermined position in the stacked body LM of the semiconductor device 1, the dummy wiring DDa is arranged so that two adjacent contacts LI1 and LI2 as the first and second plate-like portions overlap in the stacking direction of the stacked body LM. Upon measuring the positional deviation amount of the wiring D2, as described above, the distance L1$a$ between the dummy portions DMaa and DMba of the dummy wiring DDa and the distance L2$a$ between the dummy portions DMab and DMbb are measured.

In one example, an adjustment pattern DDaj is arranged around the dummy wiring DDa. The adjustment pattern DDaj is arranged to adjust the coverage around the dummy wiring DDa upon forming the dummy wiring DDa, and is formed, in parallel with the wiring D2 and the dummy wiring DDa, at the same hierarchy HIb and the same height position as the wiring D2 and the dummy wiring DDa.

The arrangement of the adjustment pattern DDaj around the dummy wiring DDa allows the difference in coverage around the dummy wiring DDa to be reduced and, for example, the critical dimension loss of the dummy wiring DDa to be reduced, making it easy to form the dummy wiring DDa to the desired dimensions.

Moreover, in the example of FIG. 10, a plurality of rectangular-shaped adjustment patterns DDaj is arranged in a grid shape, but the shapes and arrangements of the individual adjustment patterns DDaj can be set in various ways.

Second Application Example of Dummy Wiring

In the description of the variation of the dummy wiring DD mentioned above, all the dummy wirings DD include the dummy portions DM obliquely intersecting with the contact LI (slit ST) at a predetermined angle. However, as described above, due to the characteristics of the manufacturing processing of the semiconductor device 1, a pattern extending in the direction along the X-direction or the Y-direction is one of the patterns formed with particularly high accuracy.

Under such circumstances, it is difficult, in some cases, to form, for example, the dummy portion DM that is oblique to the contact LI. Even in this case, it is possible to obtain a configuration in which the positional deviation amount of the wiring D2 can be measured by the dummy wiring DD extending in the direction along the X-direction or the Y-direction. An example thereof is illustrated in FIG. 11.

As illustrated in FIG. 11, a plurality of dummy wirings DDd is arranged so that a line-and-space pattern extending along the Y-direction has a predetermined pattern, for example, imitating the elements EMa and EMb of FIGS. 3A and 3B described above. In other words, each of the plurality of dummy wirings DDd is formed in a block shape, and some of them are arranged at positions overlapping with any one of the two contacts LI1 and LI2 adjacent to each other in the Y-direction in the stacking direction of the stacked body LM.

Accordingly, at least one of both ends of the dummy wiring DDd in the Y-direction is arranged to overlap with one of the contacts LI1 and LI2. These ends differ in position between adjacent dummy wirings DDd.

In this case, the positions of the ends of the dummy wiring DDd that overlaps with the contact LI1 shift to approach the contact LI2 in some adjacent dummy wirings DDd, and shift to be away from the contact LI2 in some adjacent dummy wirings DDd.

Accordingly, by linking the positions of the ends of the dummy wiring DDd that overlaps with the contact LI1, line segments LDaa and LDba can be obtained as first and second virtual lines. The orientations in which the line segments LDaa and LDba intersect with the contact LI1 differ from each other.

In addition, the positions of the ends of the dummy wiring DDd that overlaps with the contact LI2 shift to approach the contact LI1 in some adjacent dummy wirings DDd, and shift to be away from the contact LI1 in some adjacent dummy wirings DDd.

Accordingly, by linking the positions of the ends of the dummy wiring DDd that overlaps with the contact LI2, line segments LDab and LDbb can be obtained as third and fourth virtual lines. The orientations in which the line segments LDab and LDbb intersect with the contact LI2 differ from each other.

Further, the intersection of the line segments LDaa and LDba and the intersection of the line segments LDab and LDbb are both located inside the region sandwiched by the contacts LI1 and LI2.

There are a distance L1$d$ between the two line segments LDaa and LDba at the intersection position with the slit ST1 before forming the contact LI1 and a distance L2$d$ between the two line segments LDab and LDbb at the intersection position with the slit ST2 before forming the contact LI2. In the case where positional deviation occurs in the wiring D2 in the Y-direction, by configuring the plurality of dummy wiring DDd as described above, it is possible to increase one of the two distances L1$d$ and L2$d$ and to decrease the other.

Moreover, strictly speaking, it is possible to set the distance L1$d$ and the distance L2$d$ to the distances between the dummy wirings DDd overlapping the slits ST1 and ST2, for example, at the position closest to the center position in the Y-direction of the slits ST1 and ST2 before forming the contacts LI1 and LI2. The plurality of dummy wirings DDd is constituted by a line-and-space pattern, so the distance L1$d$ and the distance L2$d$ are obtained as discontinuous values. However, it is possible to obtain a resolution of, for example, approximately ½ by adjusting the slopes of individual line segments LDaa, LDba, LDab, and LDbb, adjusting the pitch of line and space, or the like.

In this regard, regardless of the example of FIG. 11, the patterns formed by the plurality of dummy wirings DDd can be, for example, various patterns that imitate the various dummy wirings DD illustrated in FIGS. 4A and 4B described above. In addition, the plurality of dummy wirings DDd extends along the Y-direction, but they can extend along the X-direction.

Third Application Example of Dummy Wiring

As illustrated in FIG. 12, it is also possible to make a pattern in which the configuration of the second application example described above is inverted. Specifically, a plurality of dummy wirings DDe is a line-and-space pattern extending along the Y-direction and is arranged in substantially the entire region between the two contacts LI1 and LI2 adjacent to each other in the Y-direction.

In addition, some of the plurality of dummy wirings DDe have a gap DG at a position where they overlap with two adjacent contacts LI1 and LI2 in the Y-direction in the stacking direction of the stacked body LM. Such gap DG is arranged so that it has a predetermined pattern, for example, imitating the elements EMa and EMb of FIGS. 3A and 3B described above. The ends of the dummy wirings DDe constituting the pattern described above differ in position between the adjacent dummy wirings DDe.

In this case, the positions of the ends of the dummy wiring DDe that overlaps with the contact LI1 shift to approach the contact LI2 in some adjacent dummy wirings DDe, and shift to be away from the contact LI2 in some adjacent dummy wirings DDe.

Accordingly, by linking the positions of the ends of the dummy wiring DDe that overlaps with the contact LI1, line segments LEaa and LEba can be obtained as first and second virtual lines. The orientations in which the line segments LEaa and LEba intersect with the contact LI1 differ from each other.

Further, the positions of the ends of the dummy wiring DDe that overlaps with the contact LI2 shift to approach the contact LI1 in some adjacent dummy wirings DDe, and shift to be away from the contact LI1 in some adjacent dummy wirings DDe.

Accordingly, by linking the positions of the ends of the dummy wiring DDe that overlaps with the contact LI2, line segments LEab and LEbb can be obtained as third and fourth virtual lines. The orientations in which the line segments LEab and LEbb intersect with the contact LI2 differ from each other.

Further, the intersection of the line segments LEaa and LEba and the intersection of the line segments LEab and LEbb are both arranged inside the region sandwiched between the contacts LI1 and LI2.

There are a distance L1e between the two line segments LEaa and LEba at the intersection position with the slit ST1 before forming the contact LI1 and a distance L2$e$ between the two line segments LEab and LEbb at the intersection position with the slit ST2 before forming the contact LI2. In the case where positional deviation occurs in the wiring D2 in the Y-direction, by configuring the plurality of dummy wiring DDe as described above, it is possible to increase one of the two distances L1$e$ and L2$e$ and to decrease the other.

Moreover, strictly speaking, it is possible to set the distance L1$e$ and the distance L2$e$ to the distances between the dummy wirings DDe overlapping the slits ST1 and ST2, for example, at the position closest to the center position in the Y-direction of the slits ST1 and ST2 before forming the contacts LI1 and LI2. The plurality of dummy wirings DDe is constituted by a line-and-space pattern, so the distance L1$e$ and the distance L2$e$ are obtained as discontinuous values. However, it is possible to obtain a resolution of, for example, approximately ½ by adjusting the slopes of individual line segments LEaa, LEba, LEab, and LEbb, adjusting the pitch of line and space, or the like.

Further, as described above, the plurality of dummy wirings DDe covers the entire region between the contacts LI1 and LI2 substantially, so it may not necessarily arrange the adjustment pattern DDaj used for adjusting the coverage in the third application example.

In this regard, regardless of the example of FIG. 12, the patterns formed by the plurality of dummy wirings DDe can be, for example, various patterns that imitate the various dummy wirings DD illustrated in FIGS. 4A and 4B described above. In addition, the plurality of dummy wirings DDe extends along the Y-direction, but they can extend along the X-direction.

Moreover, one to be used of the second and third application examples can be determined on the basis of, for example, the brightness or the like upon observing these dummy wirings DDd and DDe by an in-line SEM or the like. In other words, of the dummy wirings DDd and DDe, the one having higher visibility by the in-line SEM can be employed appropriately.

In semiconductor devices such as three-dimensional non-volatile memory, there can be several structures in which multiple layers are arranged in a highly stacked layer. Thus, in some cases, there are cases where differences in mechanical strength and residual stress occur between the hierarchies, and these are accumulated. For this reason, for example, distortion depending on the position in the X direction and the Y direction in the plane included in the semiconductor device and stress modification between different lithography processes cause, in some cases, the positional deviation between structures arranged in different hierarchies. If configurations such as the contact arranged in a hierarchy including a stacked body and the lower layer wiring are interconnected, there is also a possibility that the connection failure occurs.

Thus, for example, it is desirable to monitor the positional deviation amount between the contact and the lower layer wiring, grasp the status of the current lot, and feedback the monitored result to the subsequent lot. However, the lower layer wiring below the contact extends and spreads out as a complicated shape, and in some cases, it is difficult to measure the positional deviation amount accurately and quantitatively using a non-destructive testing technique such as the in-line SEM.

According to the semiconductor device 1 of the first embodiment, the dummy wiring DD has the dummy portions DM that overlap with the contact LI in the stacking direction, and at least some of these dummy portions DM intersect with the contact LI in different orientations. Accordingly, the use of the dummy wiring DD to measure the positional deviation amount of the wiring D2 makes it possible to measure and manage the positional deviation between the wiring D2 and the contact C4 arranged in different hierarchies HIb and HIc during the manufacturing of the semiconductor device 1.

According to the semiconductor device 1 of the first embodiment, some dummy portions DM intersect with the contact LI1 in different orientations, and some dummy portions DM intersect with the contact LI2 in different orientations. This makes it possible to measure accurately and quantitatively the positional deviation amount of the wiring D2 without depending on the design values of the dummy portion DM such as the distance L1(0) and the distance L2(0).

Second Embodiment

A second embodiment is now described in detail with reference to the drawings. The second embodiment is different from the first embodiment in that a plurality of dummy portions DM is concentrated at a position where they overlap with one slit ST1.
(Variation of Dummy Wiring)
In the first embodiment described above, the dummy wiring DD includes the plurality of dummy portions DM overlapping the slit ST1 and the plurality of dummy portions DM overlapping the slit ST2. However, the dummy wiring DD can be configured so that the plurality of dummy portions DM included in the dummy wiring DD overlaps only one of the slits ST1 and ST2. In this instance, it is sufficient that the dummy wiring DD includes at least three dummy portions DM. FIGS. 13A to 15B illustrate some specific examples thereof.

FIGS. 13A to 15B are diagrams schematically illustrating a configuration of a dummy wiring DD based on how to measure the positional deviation amount in the semiconductor device according to the second embodiment. In the semiconductor device of the second embodiment, the positional deviation amount of the wiring D2 is also measured by a technique similar to that of the semiconductor device 1 of the first embodiment described above.

As illustrated in FIGS. 13A to 15B, these dummy wirings DD include, for example, three dummy portions DM. Of three dummy portions DM, the orientation in which one dummy portion DM arranged between the other two dummy portions DM in the X-direction intersects with the slit ST1 differs from the orientation in which the other two dummy portions DM intersect with the slit ST1. In addition, for example, the orientations in which the other two dummy portions DM intersect with the slit ST1 are substantially equal to each other.

In the examples illustrated in FIGS. 13A to 15B, the dummy portion DM included in the dummy wiring DD is configured by combining an edge obliquely intersecting at, for example, approximately 45° and an edge extending in the direction along the Y-direction. Alternatively, the dummy portion DM is configured by combining edges obliquely intersecting with each other in different orientations, for example, at approximately 45°. However, the angle of the edges is not limited to the example described above.

As illustrated in FIGS. 13A and 13B, a dummy wiring DDf includes dummy portions DMam, DMca, and DMan arranged in this order in the X-direction.

The dummy portion DMam as the first dummy portion is arranged at a position overlapping with the slit ST1 in the stacking direction of the stacked body LM, and has, for example, a rectangular shape extending obliquely from the upper left to the lower right of the figure. In other words, the dummy portion DMam has two edges extending from the upper left to the lower right of the figure and facing each other. Of these two edges, the edge as the first edge faces the dummy portion DMca. Of these two edges, the edge as the fifth edge is arranged on the side opposite to the side facing the dummy portion DMca in the X-direction. An angle θam of the dummy portion DMam according to the above definition is, for example, approximately 45°. As described above, the dummy portion DMam has a configuration similar to that of the dummy portion DMaa such as illustrated in FIGS. 4A and 4B described above.

The dummy portion DMan as the third dummy portion is arranged at a position overlapping with the slit ST1 in the stacking direction of the stacked body LM, and has, for example, a rectangular shape extending obliquely from the upper left to the lower right of the figure. In other words, the dummy portion DMan has two edges extending from the upper left to the lower right of the figure and facing each other. Of these two edges, the edge as the third edge faces the dummy portion DMca. Of these two edges, the edge as the seventh edge is arranged on the side opposite to the side facing the dummy portion DMca in the X-direction. An angle θanr of the dummy portion DMan according to the above definition is, for example, approximately 135°. As described above, the dummy portion DMan has a configuration similar to that of the dummy portion DMaa such as illustrated in FIGS. 4A and 4B described above.

As described above, the orientations in which the dummy portions DMam and DMan intersect with the slit ST1 are substantially equal to each other.

The dummy portion DMca as the second dummy portion is arranged at a position overlapping with the slit ST1 in the stacking direction of the stacked body LM, and has, for example, a rectangular shape extending in the direction along the Y-direction. In other words, the dummy portion DMca has two edges extending in the direction along the Y-direction and facing each other.

In relation to the dummy portion DMam, the dummy portion DMca has these two edges, an edge as the second edge facing the dummy portion DMam and an edge as the fifth edge arranged on the side opposite to the side facing the dummy portion DMam in the X-direction. In addition, in relation to the dummy portion DMam, an angle θcm of the dummy portion DMca according to the above definition is, for example, approximately 90°. Thus, the orientations in which the dummy portions DMca and DMam intersect with the slit ST1 differ from each other.

In relation to the dummy portion DMan, the dummy portion DMca has the two edges described above, an edge as the second edge facing the dummy portion DMan and an edge as the fifth edge arranged on the side opposite to the side facing the dummy portion DMan in the X-direction. In addition, in relation to the dummy portion DMan, an angle θcn of the dummy portion DMca according to the above definition is, for example, approximately 90°. Thus, the orientations in which the dummy portions DMca and DMan intersect with the slit ST1 differ from each other.

As described above, the dummy portion DMca has a configuration similar to that of the dummy portion DMca illustrated in FIGS. 6A and 6B described above.

As illustrated in FIG. 13A, in the case where the wiring D2 is arranged without any positional deviation amount in the Y-direction relative to each configuration of the stacked body LM, the dummy portions DMam and DMca at the intersection with the slit ST1 are arranged, for example, by a distance L1$fm$(0) apart from each other. The dummy portions DMca and DMan at the intersection with the slit ST1 are arranged, for example, by a distance L1$fn$(0) apart from each other. The distance L1$fm$(0) and the distance L1$fn$(0) may or may not be equal.

As illustrated in FIG. 13B, there is a case where the wiring D2 is arranged by deviating by a positional deviation amount ΔY in the upper direction on the figure relative to each configuration of the stacked body LM. In this case, the dummy portions DMam and DMca at the intersection position with the slit ST1 are arranged, for example, by a distance L1$fm$(ΔY) apart from each other, and the dummy portions DMca and DMan at the intersection with the slit ST1 are arranged, for example, by a distance L1$fn$(ΔY) apart from each other. In this case, the distance L1$fm$(ΔY) is shorter than the distance L1$fm$(0), and the distance L1$fn$(ΔY) is longer than the distance L1$fn$(0).

Even in the case of using the dummy wiring DDf having the above configuration as described above, it is possible to calculate the positional deviation amount ΔY of the wiring D2 relative to each configuration of the stacked body LM using the technique similar to the case of using the dummy wiring DD in the first embodiment.

The angles θam and θanr are, for example, 45° and 135°, respectively, and the angles θcm and θcn are, for example, 90°. Thus, the positional deviation amount ΔY is amplified double in the positional deviation amount measurement using the dummy wiring DDf.

As illustrated in FIGS. 14A and 14B, a dummy wiring DDg includes dummy portions DMcm, DMba, and DMcn arranged in this order in the X-direction.

The dummy portion DMcm as the first dummy portion is arranged at a position overlapping with the slit ST1 in the stacking direction of the stacked body LM, and has, for example, a rectangular shape extending in the direction along the Y-direction. In other words, the dummy portion DMcm has two edges extending in the direction along the Y-direction and facing each other. Of these two edges, the edge as the first edge faces the dummy portion DMba. Of the two edges, the edge as the fifth edge is arranged on the side opposite to the side facing the dummy portion DMba in the X-direction. An angle θcm of the dummy portion DMcm according to the above definition is, for example, approximately 90°. As described above, the dummy portion DMcm has a configuration similar to that of the dummy portion DMca described above.

The dummy portion DMcn as the third dummy portion is arranged at a position overlapping with the slit ST1 in the stacking direction of the stacked body LM, and has, for example, a rectangular shape extending in the direction along the Y-direction. In other words, the dummy portion DMcn has two edges extending in the direction along the Y-direction and facing each other. Of these two edges, the edge as the third edge faces the dummy portion DMba. Of the two edges, the edge as the seventh edge is arranged on the side opposite to the side facing the dummy portion DMba in the X-direction. An angle θcn of the dummy portion DMcn according to the above definition is, for example, approximately 90°. As described above, the dummy portion DMcn has a configuration similar to that of the dummy portion DMca described above.

In this way, the orientations in which the dummy portions DMcm and DMcn intersect with the slit ST1 are substantially equal to each other, and the dummy portions DMcm and DMcn are orthogonal to, for example, the slit ST1.

The dummy portion DMba as the second dummy portion is arranged at a position overlapping with the slit ST1 in the stacking direction of the stacked body LM, and has, for example, a rectangular shape extending obliquely from the upper right to the lower left of the figure. In other words, the dummy portion DMba has two edges extending from the upper right to the lower left of the figure and facing each other.

In relation to the dummy portion DMcm, the dummy portion DMba has these two edges, an edge as the second edge facing the dummy portion DMcm and an edge as the sixth edge arranged on the side opposite to the side facing the dummy portion DMcm in the X-direction. In addition, in relation to the dummy portion DMcm, an angle θbm of the dummy portion DMba according to the above definition is, for example, approximately 45°. Thus, the orientations in which the dummy portions DMba and DMcm intersect with the slit ST1 differ from each other.

In relation to the dummy portion DMcn, the dummy portion DMba has the two edges described above, an edge as the second edge facing the dummy portion DMcn and an edge as the sixth edge arranged on the side opposite to the side facing the dummy portion DMcn in the X-direction. In addition, in relation to the dummy portion DMcn, an angle θbnr of the dummy portion DMba according to the above definition is, for example, approximately 135°. Thus, the orientations in which the dummy portions DMba and DMcn intersect with the slit ST1 differ from each other.

As described above, the dummy portion DMba has a configuration similar to that of the dummy portion DMba such as illustrated in FIGS. 4A and 4B described above.

As illustrated in FIG. 14A, in the case where the wiring D2 is arranged without any positional deviation amount in the Y-direction relative to each configuration of the stacked body LM, the dummy portions DMcm and DMba at the intersection with the slit ST1 are arranged, for example, by a distance L1$gm$(0) apart from each other. The dummy portions DMba and DMcn at the intersection with the slit ST1 are arranged, for example, by a distance L1$gn$(0) apart from each other. The distance L1$gm$(0) and the distance L1$gn$(0) may or may not be equal.

As illustrated in FIG. 14B, there is a case where the wiring D2 is arranged by deviating by a positional deviation amount ΔY in the upper direction on the figure relative to each configuration of the stacked body LM. In this case, the dummy portions DMcm and DMba at the intersection position with the slit ST1 are arranged, for example, by a distance L1$gm$(ΔY) apart from each other, and the dummy portions DMba and DMcn at the intersection with the slit ST1 are arranged, for example, by a distance L1$gn$(ΔY) apart from each other. In this case, the distance L1$gm$(ΔY) is shorter than the distance L1$gm$(0), and the distance L1$gn$(ΔY) is longer than the distance L1$gn$(0).

Even in the case of using the dummy wiring DDg having the above configuration as described above, it is possible to calculate the positional deviation amount ΔY of the wiring D2 relative to each configuration of the stacked body LM using the technique similar to the case of using the dummy wiring DD in the first embodiment.

Moreover, the angle θbm of the dummy portion DMba relative to the dummy portion DMcm is, for example, 45°, the angle θbnr of the dummy portion DMba relative to the dummy portion DMcn is, for example, 135°, and the angles θcm and θcn are, for example, 90°. Thus, in the positional deviation amount measurement using the dummy wiring DDg, the positional deviation amount ΔY is amplified double.

As illustrated in FIGS. 15A and 15B, a dummy wiring DDh includes dummy portions DMam, DMba, and DMan arranged in this order in the X-direction.

The dummy portion DMam as the first dummy portion has a configuration similar to that of the dummy portion DMam described above. The dummy portion DMan as the third dummy portion has a configuration similar to that of the dummy portion DMan described above. The orientations in which the dummy portions DMam and DMan intersect with the slit ST1 are substantially equal to each other.

The dummy portion DMba as the second dummy portion has a configuration similar to that of the dummy portion DMba described above. The relationship between the dummy portions DMba and DMam, that is, the edge and the angle to be noted in the dummy portion DMba are similar to the relationship between the dummy portions DMba and DMcm described above, that is, the edge and the angle of the dummy portion DMba relative to the dummy portion DMcm. The relationship between the dummy portion DMba and the dummy portion DMan is similar to the relationship between the dummy portion DMba and the dummy portion DMcn described above. Thus, the orientations in which the dummy portions DMba and DMam intersect with the slit ST1 differ from each other. In addition, the orientations in which the dummy portions DMba and DMan intersect with the slit ST1 differ from each other.

As illustrated in FIG. 15A, in the case where the wiring D2 is arranged without any positional deviation amount in the Y-direction relative to each configuration of the stacked body LM, the dummy portions DMam and DMba at the intersection with the slit ST1 are arranged, for example, by a distance L1$hm$(0) apart from each other. The dummy portions DMba and DMan at the intersection with the slit ST1 are arranged, for example, by a distance L1$hn$(0) apart from each other. The distance L1$hm$(0) and the distance L1$hn$(0) may or may not be equal.

As illustrated in FIG. 15B, there is a case where the wiring D2 is arranged by deviating by a positional deviation amount ΔY in the upper direction on the figure relative to each configuration of the stacked body LM. In this case, the dummy portions DMam and DMba at the intersection position with the slit ST1 are arranged, for example, by a distance L1$hm$(ΔY) apart from each other, and the dummy portions DMba and DMan at the intersection with the slit ST1 are arranged, for example, by a distance L1$hn$(ΔY) apart from each other. In this case, the distance L1$hm$(ΔY) is shorter than the distance L1$hm$(0), and the distance L1$hn$(ΔY) is longer than the distance L1$hn$(0).

Even in the case of using the dummy wiring DDh having the above configuration as described above, it is possible to calculate the positional deviation amount ΔY of the wiring D2 relative to each configuration of the stacked body LM using the technique similar to the case of using the dummy wiring DD in the first embodiment.

Moreover, the angle θbm of the dummy portion DMba relative to the dummy portion DMam is, for example, 45°, the angle θbnr of the dummy portion DMba relative to the dummy portion DMan is, for example, 135°. The angle θam is, for example, 45°, and the angle θanr is, for example, 135°. Thus, in the positional deviation amount measurement using the dummy wiring DDh, the positional deviation amount ΔY is amplified four times.

As described above, the following assumption is achievable in the dummy wiring DD in which, for example, three dummy portions DM are arranged at positions overlapping with one slit ST1 in the stacking direction. Of the three dummy portions DM, the angle of one of the dummy portions DM on both sides in the X-direction can be set to more than 0° and 90° or less, and the angle of the other can be set to 90° or more and less than 180°. In this case, the angle of the dummy portion DM between the two dummy portions DM can be set to a value different from that of the two dummy portions DM within a range of more than 0° and less than 180°.

Further, there are the intersection of the edge of the dummy portion DM arranged between two dummy portions DM and the edge of the dummy portion DM on one side thereof or the intersection of their extension lines. In addition, there are the intersection of the edge of the dummy portion DM arranged between two dummy portions DM and the edge of the dummy portion DM on other side thereof or the intersection of their extension lines. It is possible to configure the dummy wiring DD so that one of these intersections is arranged on one side of the slit ST1 in the Y-direction, the other is arranged on the other side of the slit ST1 in the Y-direction.

In one example, in the dummy wiring DDf of FIGS. 13A and 13B described above, the intersection between the extension lines of the dummy portions DDam and DMca is located below in the figure relative to the slit ST1. The intersection between the extension lines of the dummy portions DMca and DMan is located above in the figure relative to the slit ST1.

Further, in one example, in the dummy wiring DDg of FIGS. 14A and 14B described above, the intersection between the extension lines of the dummy portions DDcm and DMba is located below in the figure relative to the slit ST1. The intersection between the extension lines of the dummy portions DMba and DMcn is located above in the figure relative to the slit ST1.

Further, in one example, in the dummy wiring DDh of FIGS. 15A and 15B described above, the intersection between the extension lines of the dummy portions DDam and DMba is located below in the figure relative to the slit ST1. The intersection between the extension lines of the dummy portions DMba and DMan is located above in the figure relative to the slit ST1.

There are a distance between one set of dummy portions DM intersecting with the slit ST1 and a distance between the other set of dummy portions DM intersecting with the slit ST1. In the case where the wiring D2 deviates in the Y-direction, the dummy wiring DD configured as described above makes it possible to increase one of the two distances and to decrease the other.

First Application Example of Dummy Wiring

Some examples of applying the dummy wirings DD as described above to the semiconductor device of the second embodiment are now described. FIGS. 16 and 17 are diagrams schematically illustrating an application of the dummy wiring DD to the semiconductor device according to the second embodiment.

An example in which the dummy wiring DDh of FIG. 15 described above is applied to the semiconductor device of the second embodiment is first described with reference to FIG. 16.

As illustrated in FIG. 16, at a predetermined position in the stacked body LM of the semiconductor device of the second embodiment, the dummy wiring DDh is arranged so that the contact LI1 as the first plate-like portion overlap in the stacking direction of the stacked body LM. Upon measuring the positional deviation amount of the wiring D2, as described above, the distance L1$hm$ between the dummy portions DMam and DMba of the dummy wiring DDh and the distance L1$hn$ between the dummy portions DMba and DMan are measured.

In the semiconductor device of the second embodiment, for example, the adjustment pattern DDaj is also arranged around the dummy wiring DDh.

Second Application Example of Dummy Wiring

As illustrated in FIG. 17, also in the semiconductor device of the second embodiment, a configuration having a predetermined pattern that imitates the FIG. 16 as described above from a plurality of dummy wirings DDi can be obtained, similarly to the second application example of the first embodiment described above.

In the second application example, each of the plurality of dummy wirings DDi is formed in a block shape, and some of them have an end arranged at a position overlapping with the contact LI1 in the stacking direction of the stacked body LM. These ends differ in position between adjacent dummy wirings DDi.

In this case, the positions of the ends of the dummy wiring DDi that overlaps with the contact LI1 shift to approach other contacts LI adjacent to the contact LI1 in some adjacent dummy wirings DDi. In addition, in some adjacent dummy wirings DDi, the position shifts to be away from other contacts LI.

Accordingly, by linking the positions of the ends of the dummy wiring DDi that overlaps with the contact LI1, line segments LNam, LNba, and LNan as the respective first to third virtual lines arranged in this order in the X-direction can be obtained. The orientation in which the line segment LNba arranged between the line segments LNam and LNan intersects with the contact LI1 differs from the orientation in which the line segments LNam and LNan intersect with the contact LI1. In addition, the orientations in which the line segments LNam and LNan intersect with the contact LI1 are equal to each other.

Further, the intersection between the extension lines of the line segments LNam and LNba is located below in the figure relative to the contact LI, and the intersection between the extension lines of the line segments LNba and LNan is located above in the figure relative to the contact LI.

There are a distance L1$im$ between the two line segments LNam and LNba and a distance L1in between the two line segments LNab and LNan at the respective intersection positions with the slit ST1 before forming the contact LI1. In the case where the wiring D2 deviates in the Y-direction, the plurality of dummy wirings DDi configured as described above makes it possible to increase one of the two distances and to decrease the other.

Moreover, strictly speaking, it is possible to set the distance L1$im$ and the distance L1in to the distances between the dummy wirings DDi that overlap with the slit ST1 at the position closest to the center position in the Y-direction of the slit ST1 before the contact LI1 is formed.

Further, regardless of the example of FIG. 17, the pattern formed by the plurality of dummy wirings DDi can be an inverted one of the pattern of FIG. 17. In addition, the plurality of dummy wirings DDi can extend in a direction along the X-direction instead of the Y-direction.

According to the semiconductor device of the second embodiment, effects similar to those of the semiconductor device 1 of the first embodiment are achieved.

According to the semiconductor device of the second embodiment, the dummy wiring DD includes three or more dummy portions DM at positions overlapping the contact LI1 in the stacking direction. The orientation in which the dummy portion DM between the two dummy portions DM intersects with the contact LI1 differs from the orientation in which the other dummy portions DM on both sides intersect with the contact LI1.

Accordingly, for example, the integration of the dummy wirings DD on one contact LI1 makes it possible to further reduce the number of dummy wirings DM to be measured and to reduce the size of the dummy wiring DD. Thus, it is possible to increase the option to choose the position where the dummy wiring DD can be arranged relative to the stacked body LM, arranging a large number of dummy wirings DD relative to the stacked body LM at a higher density.

Further, the stress received by the stacked body LM or the like varies depending on the position in the Y-direction, so the positional deviation amount of the wiring D2 also varies at the position in the Y-direction. In one example, the integration of the dummy wirings DD on one contact LI1 makes it possible to specify the positional deviation amount at a pinpointed position in the Y-direction.

Further, for example, as compared with the case where the dummy wiring DD is arranged over the two contacts LI1 and LI2, the wiring D2 or the like can be passed through between the two contacts LI1 and LI2 without being blocked by the dummy wiring DD, making it easy to design the semiconductor device.

Third Embodiment

A third embodiment is now described in detail with reference to the drawings. The third embodiment is different from the first and second embodiments described above in that the dummy wiring DD includes a dummy portion having an edge to be measured on both sides in the X-direction.

(Variation of Dummy Wiring)

In the first and second embodiments described above, each dummy portion DM has one edge to be measured and has another edge extending in the direction along the edge at a position facing the X-direction. However, one dummy portion can have a plurality of edges to be measured. FIGS. 18A to 20B illustrate some specific examples thereof.

FIGS. 18A to 20B are diagrams schematically illustrating a configuration of the dummy wiring DD based on how to measure the positional deviation amount in the semiconductor device according to the third embodiment.

Moreover, herein, in some cases, a dummy portion that includes a plurality of edges to be measured and dummy portions that include many variations described below are collectively called "dummy portion DS". In addition, edges of such a dummy portion DS are collectively called "edge DE", in some cases.

As illustrated in FIGS. 18A to 20B, the dummy wiring DD includes, for example, the dummy portion DS having a plurality of edges DE to be measured. In the semiconductor device of the third embodiment, the positional deviation amount of the wiring D2 is also measured by a technique similar to that of the semiconductor device of the first and second embodiments described above.

Figure 18A:
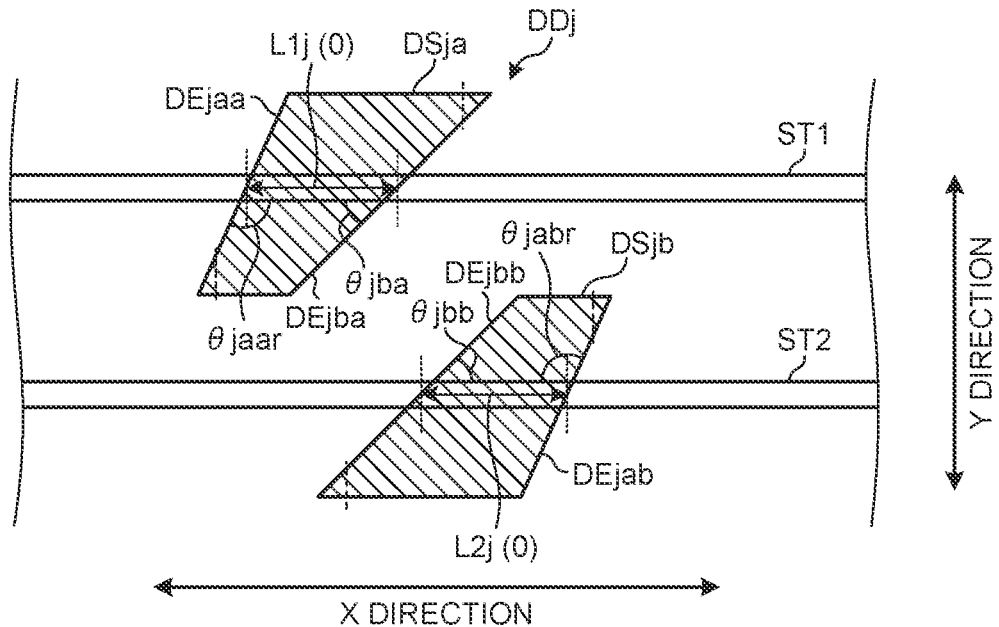
FIGS. 18A and 18B are diagrams schematically illustrating a configuration of the dummy wiring based on how to measure the positional deviation amount in a semiconductor device according to a third embodiment.
Figure 18B:
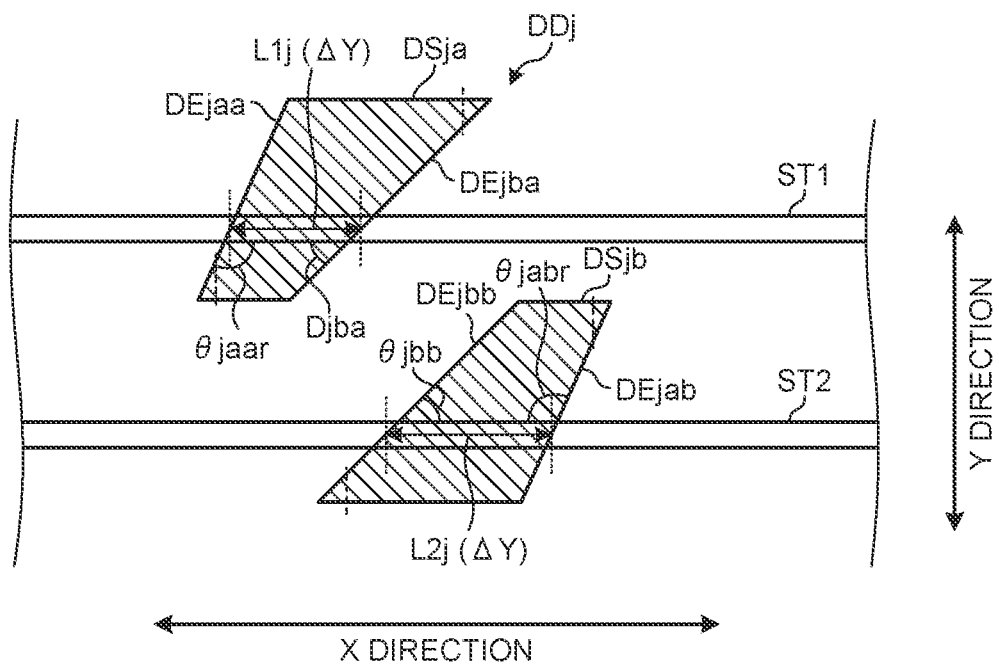

As illustrated in FIGS. 18A and 18B, a dummy wiring DDj includes dummy portions DSja and DSjb arranged at positions overlapping with any one of two slits ST1 and ST2 adjacent to each other in the Y-direction in the stacking direction of the stacked body LM. In other words, the configuration described in the first embodiment is applied to the dummy wiring DDj.

The dummy portion DSja as the fifth dummy portion is arranged at a position overlapping with the slit ST1 in the stacking direction of the stacked body LM. The dummy portion DSja includes two edges DEjaa and DEjba facing each other in the X-direction. The orientation in which the edge DEjaa as the first edge intersects with the slit ST1 and the orientation in which the edge DEjba as the second edge intersects with the slit ST1 differ from each other.

Further, an angle θjaar of the edge DEjaa according to the above definition and an angle θjba of the edge DEjba according to the above definition differ from each other. However, if the orientations in which the edges DEjaa and DEjba intersect with the slit ST1 are different, the angles θjaar and θjba can be equal to each other.

The dummy portion DSjb as the sixth dummy portion is arranged at a position overlapping with the slit ST2 in the stacking direction of the stacked body LM. The dummy portion DSjb includes two edges DEjab and DEjbb facing each other in the X-direction. The orientation in which the edge DEjab as the first edge intersects with the slit ST2 and the orientation in which the edge DEjbb as the second edge intersects with the slit ST2 differ from each other.

Further, an angle θjabr of the edge DEjab according to the above definition and an angle θjbb of the edge DEjbb according to the above definition differ from each other. However, if the orientations in which the edges DEjab and DEjbb intersect with the slit ST2 are different, the angles θjabr and θjbb can be equal to each other.

Moreover, in the examples of FIGS. 18A and 18B, the dummy portion DSjb has a shape in which the dummy portion DSja is inverted in the X-direction and the Y-direction, the angles θjaar and θjabr are equal to each other, and the angles θjba and θjbb are equal to each other. However, these configurations are not strictly necessary.

In other words, it is possible to configure the dummy wiring DDj following the configuration described in the first embodiment, as described above. In one example, the edge DEjaa corresponds to the dummy portion DMaa of the first embodiment described above, and can be configured following the dummy portion DMaa of the first embodiment and its variations. In addition, the edge DEjba corresponds to, for example, the dummy portion DMba of the first embodiment described above and can be configured following the dummy portion DMba of the first embodiment and its variations.

Further, the edge DEjab corresponds to, for example, the dummy portion DMab of the first embodiment described above and can be configured similarly to the dummy portion DMab of the first embodiment and its variations. In addition, the edge DEjbb corresponds to, for example, the dummy portion DMbb of the first embodiment described above, and can be configured similarly to the dummy portion DMbb of the first embodiment and its variations.

Moreover, the dummy portions DSja and DSjb have a trapezoidal shape, and in the examples of FIGS. 18A and 18B, two of four vertices have acute angles. Suppose the configuration of the dummy portions DSja and DSjb is applied to the semiconductor device of the third embodiment. In that case, it is preferable to cut the apex having an internal angle of less than 90° so that the dummy portions DSja and DSjb have a shape with no acute angle.

Due to the characteristics of the manufacturing process of semiconductor devices, the critical dimension loss tends to be large in an acute-angled part. The use of the dummy wiring DDj with no acute-angled part makes it possible to prevent or reduce the influence of the critical dimension loss of the acute-angled part on the finished dimensions of the edges DEjaa, DEjba, DEjab, and DEjbb to be measured. It is unnecessary to form the dummy portions DSja, DSjb in a large size to obtain the distance of the parts where the edges DEjaa, DEjba, DEjab, and DEjbb have the desired dimensions.

Further, upon forming the mold of the dummy portions DSja and DSjb on the insulating layer 51 and filling the wiring material, in some cases, chemical mechanical polishing (CMP) or the like is used. In this case, the frictional resistance of the acute-angled part is likely to increase. The use of the dummy wiring DDj with no acute-angled part makes it possible to prevent or reduce the occurrence of film peeling or the like starting from the acute-angled part.

As illustrated in FIG. 18A, suppose the wiring D2 is arranged without any positional deviation amount in the Y-direction relative to each configuration of the stacked body LM. In that case, the edges DEjaa and DEjba on both sides of the dummy portion DSja in the X-direction at the intersection positions with the slit ST1 are separated, for example, by a distance L1$j$(0). In addition, the edges DEjab and DEjbb on both sides of the dummy portion DSjb in the X-direction at the intersection positions with the slit ST2 are separated, for example, by a distance L2$j$(0). The distance L1$j$(0) and the distance L2$j$(0) may or may not be equal.

As illustrated in FIG. 18B, suppose the wiring D2 deviates by the positional deviation amount ΔY in the upper direction on the figure relative to each configuration of the stacked body LM. In that case, the edges DEjaa and DEjba of the dummy portion DSja at the intersection positions with the slit ST1 are separated, for example, by a distance L1$j$(ΔY). In addition, the edges DEjab and DEjbb of the dummy portion DSjb at the intersection positions with the slit ST2 are separated, for example, by a distance L2$j$(ΔY). In this case, the distance L1$j$(ΔY) is shorter than the distance L1$j$(0), and the distance L2$j$(ΔY) is longer than the distance L2$j$(0).

As described above, it is possible to calculate the positional deviation amount ΔY of the wiring D2 relative to each configuration of the stacked body LM using a technique similar to the case of using the dummy wiring DD illustrated in the first embodiment described above.

In the examples illustrated in FIGS. 19A to 20B described below, the dummy portion DS included in the dummy wiring DD is configured by combining, for example, an edge DE that intersects obliquely at approximately 45°, an edge that extends in the direction along the X-direction, and an edge DE extending in the direction along the Y-direction. However, the angle of the edge DE is not limited to the examples above.

Figure 19A:
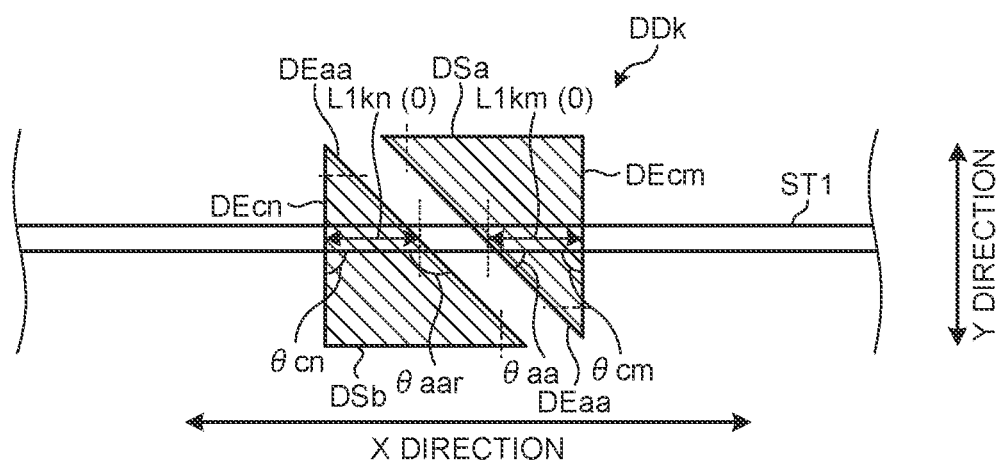
FIGS. 19A and 19B are diagrams schematically illustrating a configuration of the dummy wiring based on how to measure the positional deviation amount in the semiconductor device according to the third embodiment.
Figure 19B:
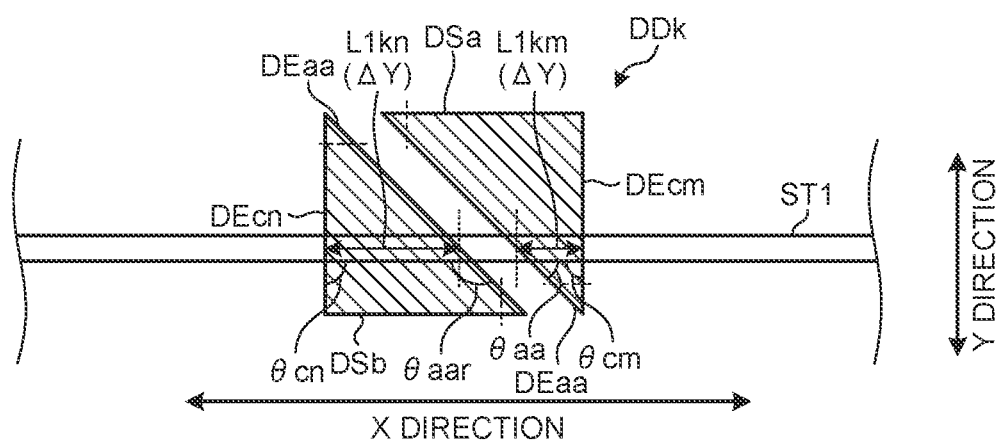

As illustrated in FIGS. 19A and 19B, a dummy wiring DDk includes dummy portions DSa and DSb arranged at positions overlapping with one slit ST1 in the stacking direction of the stacked body LM. In other words, the configuration described in the second embodiment is applied to the dummy wiring DDk.

The dummy portion DSa has, for example, a right-angled triangle shape that combines an edge DEaa that obliquely intersects at approximately 45°, an edge that extends in the direction along the X-direction, and an edge DEcm that extends in the direction along the Y-direction. The dummy portion DSb has an arrangement in which the dummy portion DSa is inverted in the X-direction and the Y-direction. The dummy portion DSb has, for example, a right-angled triangle shape that combines an edge DEaa that obliquely intersects at approximately 450, an edge that extends in the direction along the X-direction, and an edge DEcn that that extends in the direction along the Y-direction.

The dummy portion DSa as the fifth dummy portion is arranged at a position overlapping with the slit ST1 in the stacking direction of the stacked body LM. The dummy portion DSa includes two edges DEaa and DEcm facing each other in the X-direction. The orientation in which the edge DEaa as the second edge intersects with the slit ST1 and the orientation in which the edge DEcm as the first edge intersects with the slit ST1 differ from each other.

Further, an angle θaa of the edge DEaa according to the above definition is, for example, approximately 45°. An angle θcm of the edge DEcm according to the above definition is, for example, approximately 90°. In other words, the edge DEcm is orthogonal to the slit ST1. In this way, for example, the angle θaa and the angle θcm differ from each other.

The dummy portion DSb as the seventh dummy portion is arranged at a position overlapping with the slit ST1 in the stacking direction of the stacked body LM. The dummy portion DSb includes two edges DEaa and DEcn facing each other in the X-direction. In other words, the dummy portion DSb also includes the edge DEaa as the second edge. The orientation in which the edge DEaa intersects with the slit ST1 and the orientation in which the edge DEcn as the third edge intersects with the slit ST1 differ from each other.

Further, an angle θaar of the edge DEaa according to the above definition is, for example, approximately 135°. An angle θcn of the edge DEcn according to the above definition is, for example, approximately 90°. In other words, the edge DEcn is orthogonal to the slit ST1. Therefore, for example, the angle θaar and the angle θcn differ from each other.

Further, the angle θcm of the edge DEcm according to the above definition and the angle θcn of the edge DEcn according to the above definition are equal to each other. Furthermore, the orientation in which the edge DEcm intersects with the slit ST1 and the orientation in which the edge DEcn intersects with the slit ST1 are equal to each other.

Moreover, in the dummy portions DSa and DSb, two of the three vertices have acute angles, and in the case where the dummy portions DSa and DSb are applied to the semiconductor device of the third embodiment, it is preferable to cut such an acute-angled part.

As illustrated in FIG. 19A, suppose the wiring D2 is arranged without any positional deviation amount in the Y-direction relative to each configuration of the stacked body LM. In that case, the edges DEaa and DEcm on both sides of the dummy portion DSa in the X-direction at the intersection positions with the slit ST1 are separated, for example, by a distance L1$km$(0). In addition, the edges DEaa and DEcn on both sides of the dummy portion DSb in the X-direction at the intersection positions with the slit ST1 are separated, for example, by a distance L1$kn$(0). The distance L1$km$(0) and the distance L1$kn$(0) may or may not be equal.

As illustrated in FIG. 19B, suppose the wiring D2 deviates by the positional deviation amount ΔY in the upper direction on the figure relative to each configuration of the stacked body LM. In that case, the edges DEaa and DEcm of the dummy portion DSa at the intersection positions with the slit ST1 are separated, for example, by a distance L1$km$(ΔY). In addition, the edges DEaa and DEcn of the dummy portion DSb at the intersection positions with the slit ST1 are separated, for example, by a distance L1$kn$(ΔY). In this case, the distance L1$km$(ΔY) is shorter than the distance L1$km$(0), and the distance L1$kn$(ΔY) is longer than the distance L1$kn$(0).

As described above, it is possible to calculate the positional deviation amount ΔY of the wiring D2 relative to each configuration of the stacked body LM using a technique similar to the case of using the dummy wiring DD illustrated in the second embodiment described above.

Moreover, the angle θaa of the edge DEaa relative to the edge DEcm is, for example, 45°, the angle θaar of the edge DEaa relative to the edge DEcn is, for example, 135°, and the angles θcm and θcn of the respective edges DEcm and DEcn are, for example, 90°. Thus, in the positional deviation amount measurement using the dummy wiring DDk, the positional deviation amount ΔY is amplified double.

As described above, the edges DEaa, DEcm, and DEcn of the dummy portions DSa and DSb to be measured obliquely intersect at, for example, 45°, or extend along the Y-direction. This makes it easy to form the dummy portions DSa and DSb having desired dimensions with higher accuracy.

However, it is possible to configure the dummy wiring DDk in various forms following the configuration described in the second embodiment. In one example, the edge DEaa corresponds to the dummy portions DMam and DMan of the second embodiment described above, and can be configured, following the dummy portions DMam and DMan of the second embodiment and their variations. In addition, the edges DEcm and DEcn correspond to, for example, the dummy portions DMcm and DMcn of the second embodiment described above, respectively, and can be configured following the dummy portions DMcm and DMcn of the second embodiment and their variations.

Further, in the above-mentioned dummy wiring DDk, the dummy portions DSa and DSb are both provided with the edge DEaa. However, for example, suppose the distance between the dummy portions DSa and DSb is also added to the measurement target, it is possible to have a configuration in which the two dummy portions DS do not share the same edge DE. An example thereof is illustrated in FIG. 20.

Figure 20A:
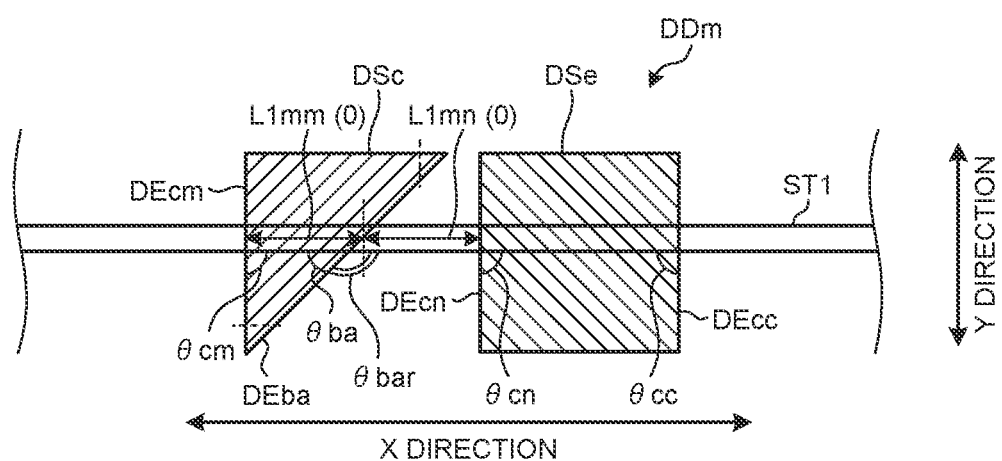
FIGS. 20A and 20B are diagrams schematically illustrating a configuration of the dummy wiring based on how to measure the positional deviation amount in the semiconductor device according to the third embodiment.
Figure 20B:
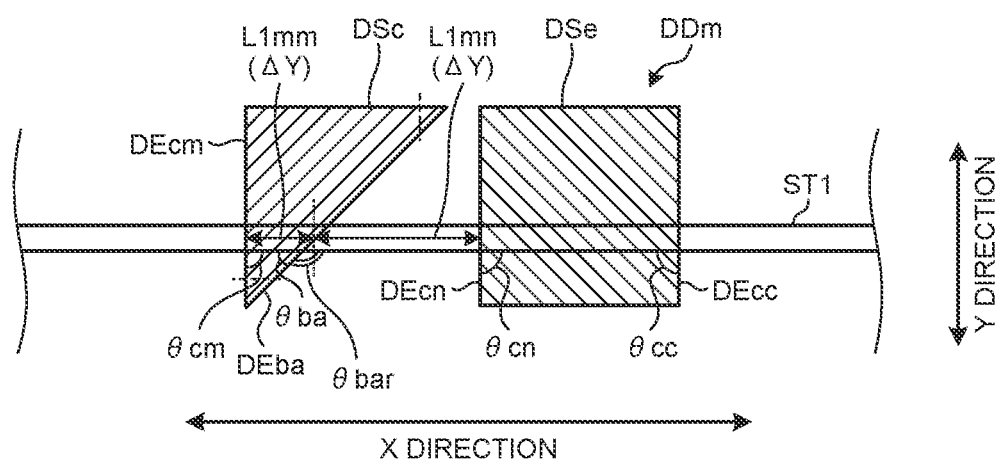

As illustrated in FIGS. 20A and 20B, a dummy wiring DDm includes dummy portions DSc and DSe arranged at positions overlapping with one slit ST1 in the stacking direction of the stacked body LM. In other words, the configuration described in the second embodiment is also applied to the dummy wiring DDm.

The dummy portion DSc as the fifth dummy portion is arranged at a position overlapping with the slit ST1 in the stacking direction of the stacked body LM. The dummy portion DSc includes two edges DEba and DEcm facing each other in the X-direction. The orientation in which the edge DEba as the second edge intersects with the slit ST1 and the orientation in which the edge DEcm as the first edge intersects with the slit ST1 differ from each other.

The dummy portion DSe as the seventh dummy portion is arranged at a position overlapping with the slit ST1 in the stacking direction of the stacked body LM. The dummy portion DSe includes two edges DEcn and DEcc facing each other in the X-direction.

In the examples of FIGS. 20A and 20B, the orientation in which the edge DEcn as the third edge intersects with the slit ST1 and the orientation in which edge DEcc as the ninth edge intersects with the slit ST1 are equal to each other. In addition, an angle θcn of the edge DEcn according to the above definition and the angle θcc of the edge DEcc according to the above definition are equal to each other.

However, such a relationship between the edges DEcn and DEcc is optional, and it does not matter what kind of relationship the edges DEcn and DEcc have. In other words, the edge DEcc is not a measurement target, so it can intersect with the slit ST1 in any orientation and angle.

The relationship between the edge DEcn that is the measurement target and the edges DEba and DEcm included in the dummy portion DSc is described below.

The orientation in which the edge DEcn and the slit ST1 intersect differs from the orientation in which the edge DEba included in the dummy portion DSc and the slit ST1 intersect. In addition, the angle θcn of the edge DEcn according to the above definition and the angle θba of the edge DEba according to the above definition differ from each other.

Further, the angle θcn of the edge DEcn according to the above definition and the angle θcm of the edge DEcm included in the dummy portion DSc according to the above definition are equal to each other. Furthermore, the orientation in which the edge DEcn intersects with the slit ST1 and the orientation in which the edge DEcm intersects with the slit ST1 are equal to each other.

In this regard, it is possible to configure the dummy wiring DDm following the configuration described in the second embodiment as described above. In one example, the edge DEba corresponds to the dummy portion DMba of the second embodiment described above, and can be configured following the dummy portion DMba of the second embodiment and its variations.

Further, the edge DEcm corresponds to, for example, the dummy portion DMcm of the second embodiment described above, and can be configured following the dummy portion DMcm of the second embodiment and its variations. In addition, the edge DEcn corresponds to, for example, the dummy portion DMcn of the second embodiment described above, and can be configured following the dummy portion DMcn of the second embodiment and its variations.

As illustrated in FIG. 20A, there is a case where the wiring D2 is arranged without any positional deviation amount in the Y-direction relative to each configuration of the stacked body LM. In that case, the edges DEba and DEcm on both sides of the dummy portion DSc in the X-direction at the intersection position with the slit ST1 are separated, for example, by a distance L1$mm$(0). In addition, the edge DEba of the dummy portion DSc and the edge DEcn of the dummy portion DSe at the intersection position with the slit ST1 are separated, for example, by a distance L1$mn$(0). The distance L1$mm$(0) and the distance L1$mn$(0) may or may not be equal.

As illustrated in FIG. 20B, there is a case where the wiring D2 deviates by the positional deviation amount ΔY in the upper direction on the figure relative to each configuration of the stacked body LM. In that case, the edges DEba and DEcm of the dummy portion DSc at the intersection position with the slit ST1 are separated, for example, by a distance L1$mm$(ΔY). In addition, the edge DEba of the dummy portion DSc and the edge DEcn of the dummy portion DSe at the intersection position with the slit ST1 are separated, for example, by a distance L1$mn$(ΔY). In this case, the distance L1$mm$(ΔY) is shorter than the distance L1$mm$(0), and the distance L1$mn$(ΔY) is longer than the distance L1$mn$(0).

As described above, it is possible to calculate the positional deviation amount ΔY of the wiring D2 relative to each configuration of the stacked body LM using a technique similar to the case of using the dummy wiring DD illustrated in the second embodiment described above.

Moreover, the angle θba of the edge DEba relative to the edge DEcm is, for example, 45°, the angle θbar of the edge DEba relative to the edge DEcn is, for example, 135°, and the angles θcm and θcn of the respective edges DEcm and DEcn are, for example, 90°. Thus, in the positional deviation amount measurement using the dummy wiring DDm, the positional deviation amount ΔY is amplified double.

First Application Example of Dummy Wiring

Some examples of applying the various dummy wirings DD as described above to the semiconductor device of the third embodiment are now described. FIGS. 21 to 24 are diagrams schematically illustrating an application of the dummy wiring DD to the semiconductor device according to the third embodiment.

An example in which the dummy wiring DDk of FIGS. 19A and 19B described above is applied to the semiconductor device of the third embodiment is first described with reference to FIG. 21.

Figure 21:
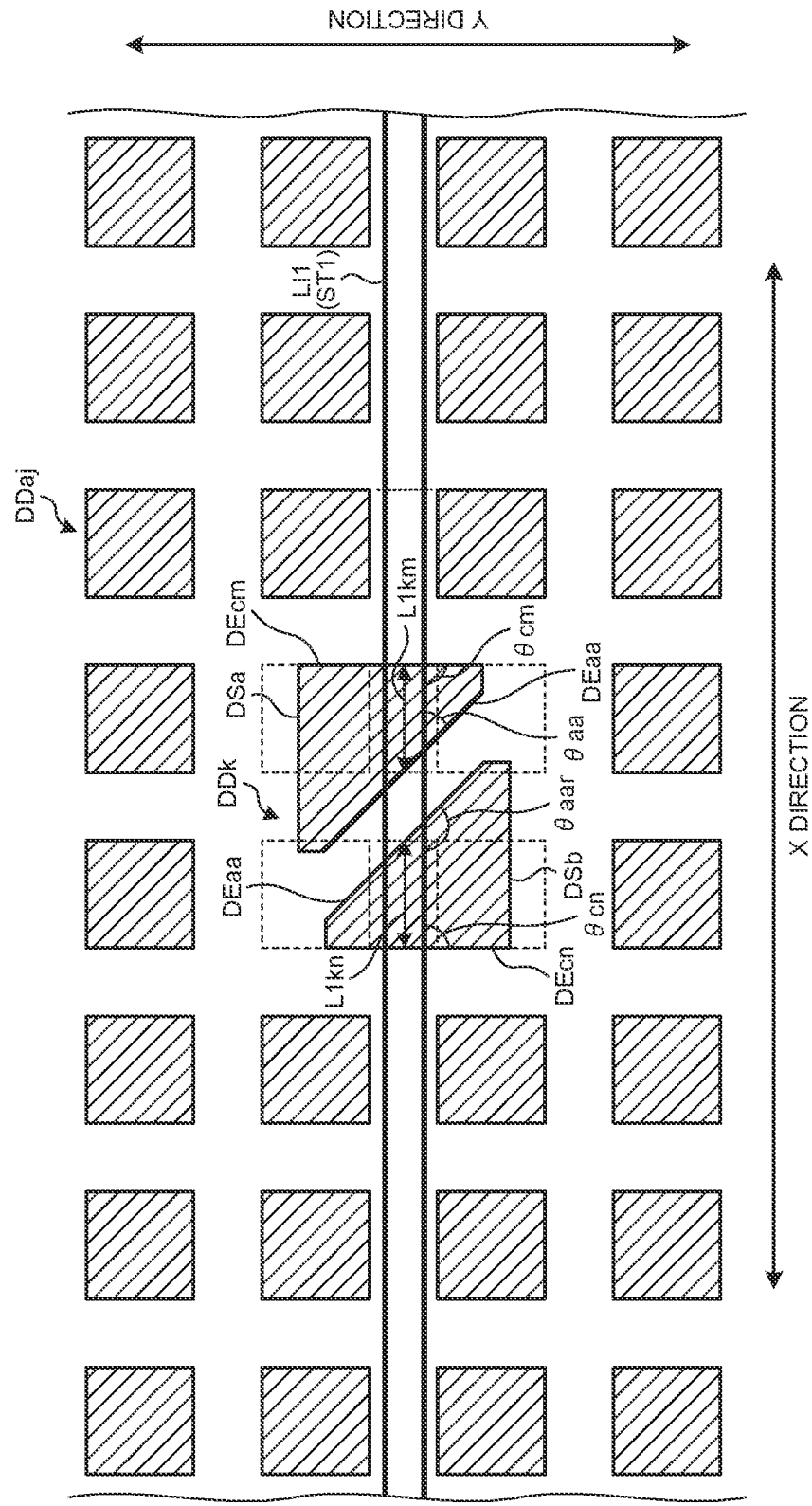
FIG. 21 is a diagram illustrating an example of application of the dummy wiring to the semiconductor device according to the third embodiment.

As illustrated in FIG. 21, in the semiconductor device of the third embodiment, for example, the adjustment pattern DDaj is also arranged around the dummy wiring DDk.

In the dummy wiring DDk, for example, two dummy portions DSa and DSb having a right-angled triangle shape are arranged in a space equivalent to four patterns as the adjustment pattern DDaj. In this case, the dummy wiring DDk is arranged at a position overlapping with the contact LI1 as the first plate-like portion in the stacking direction of the stacked body LM.

Upon measuring the positional deviation amount of the wiring D2, the distance L1$km$ between the edges DEaa and DEcm and the distance L1$kn$ between the edges DEaa and DEcn are measured from the opening of the slit ST1, as described above. In the dummy wiring DDk, the edges DEaa and DEcm are on both sides of the dummy portion DSa in the X-direction, and the edges DEaa and DEcn are on both sides of the dummy portion DSb in the X-direction.

Second Application Example of Dummy Wiring

Figure 22:
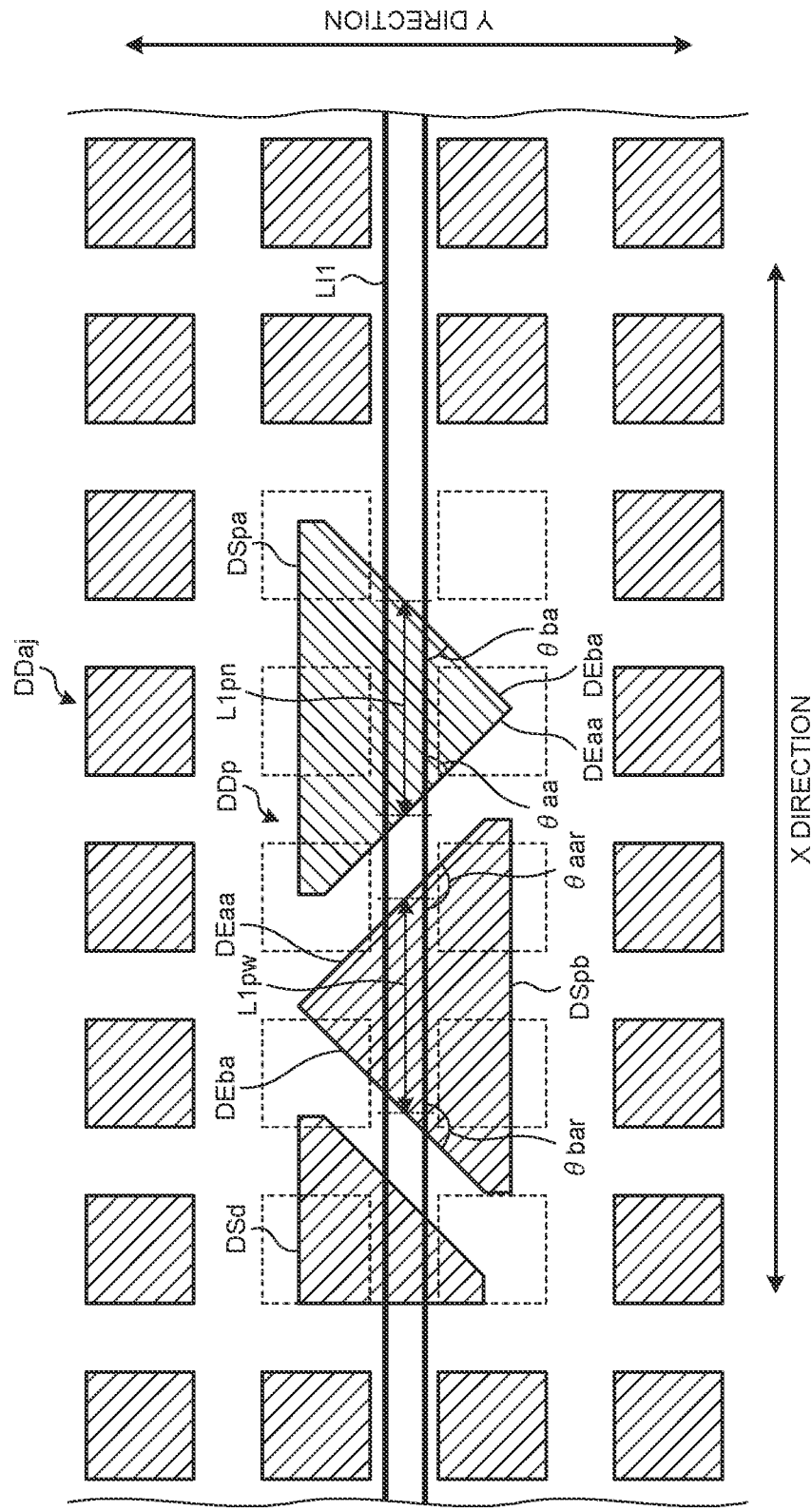
FIG. 22 is a diagram illustrating an example of application of the dummy wiring to the semiconductor device according to the third embodiment.

As illustrated in FIG. 22, in a dummy wiring DDp, a large number of dummy portions DS having a right-angled triangle shape are also combined. In the dummy wiring DDp, for example, two dummy portions DS having a right-angled triangle shape are combined back to back, and distances L1$pn$ and L1$pw$ between outermost edges thereof are measured.

Specifically, in the dummy wiring DDp, a periodic pattern DSd and dummy portions DSpb and DSpa are arranged in this order in the X-direction in a space equivalent to 10 patterns as the adjustment pattern DDaj.

The dummy portion DSpa has a shape in which portions orthogonal to the contact LI1 are connected in, for example, two right-angled triangle patterns, and the portions obliquely intersect at, for example, approximately 45°. The dummy portion DSpa includes two edges DEaa and DEba facing each other in the X-direction. In the dummy portion DSpa, the measurement target is the distance L1$pn$ between the intersections of the two edges DEaa and DEba facing each other in the X-direction with the contact LI1.

The dummy portion DSpb has a shape similar to that of the dummy portion DSpa except that the dummy portion DSpa is inverted in the Y-direction. In the dummy portion DSpb, the measurement target is the distance L1$pw$ between the intersections of the two edges DEaa and DEba facing each other in the X-direction with the contact LI1.

As described above, it is possible to calculate the positional deviation amount ΔY of the wiring D2 relative to each configuration of the stacked body LM using a technique similar to the case of using the dummy wiring DD illustrated in the second embodiment described above.

Moreover, the angles θaa and θba of the two respective edges, DEaa and DEba, of the dummy portion DSpa are both, for example, 45°. The angles θaar and θbar of the two respective edges, DEaa and DEba, of the dummy portion DSpb are, for example, 135°. Thus, in the positional deviation amount measurement using the dummy wiring DDp, the positional deviation amount ΔY is amplified four times.

In one example, even upon using a right-angled triangle pattern having an edge obliquely intersecting at 45° and an edge orthogonal to the contact LI at 90°, the combination of these right-angled triangle patterns like the dummy wiring DDp makes it possible to detect the positional deviation amount ΔY by amplifying it four times.

Moreover, the periodic pattern DSd on one side in the X-direction is a dummy pattern arranged to maintain the periodic pattern of the dummy wiring DDp.

Third Application Example of Dummy Wiring

Figure 23:
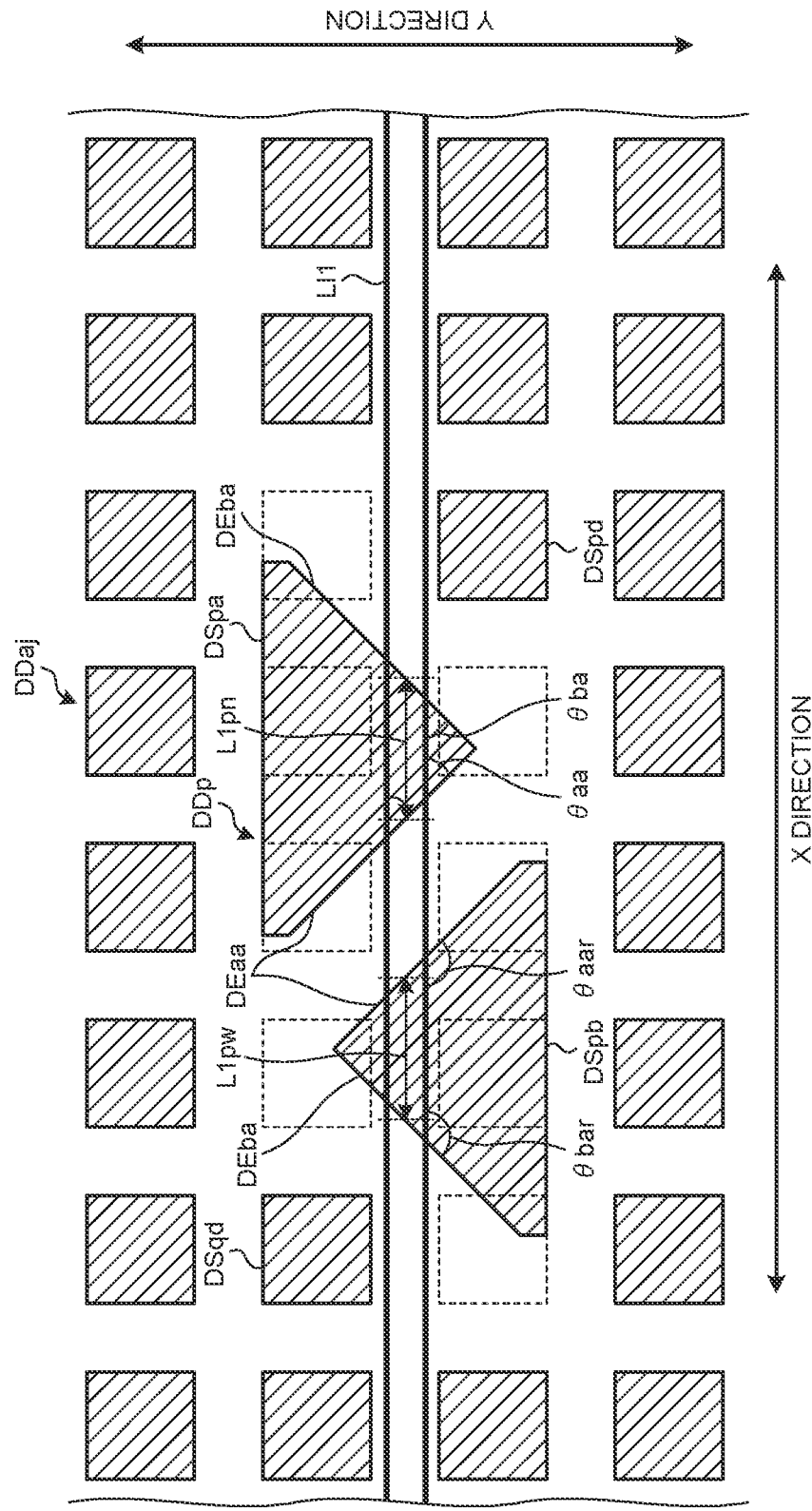
FIG. 23 is a diagram illustrating an example of application of the dummy wiring to the semiconductor device according to the third embodiment.

FIG. 23 is an example in which a different periodic pattern DSqd is arranged in the peripheral region of the dummy wiring DDp. The periodic pattern DSqd has, for example, a rectangular shape and is arranged at both ends of the dummy wiring DDp in the X-direction, similarly to the adjustment pattern DDaj.

The dummy wiring DDp includes the periodic pattern DSqd at both ends in the X-direction and is arranged in the space equivalent to 10 patterns as the adjustment pattern DDaj. Thus, the dummy wiring DDp itself has a configuration similar to that of the dummy wiring DDp of FIG. 22 described above.

By setting the periodic pattern DSqd as a pattern of a small size like the adjustment pattern DDaj, it can be arranged on both sides of the dummy wiring DDp in the X-direction. Thus, it is possible to maintain the symmetry of the region where the dummy wiring DDp is arranged and to form the dummy wiring DDp to a desired dimension with ease, further improving the accuracy of the positional deviation amount measurement.

Fourth Application Example of Dummy Wiring

Figure 24:
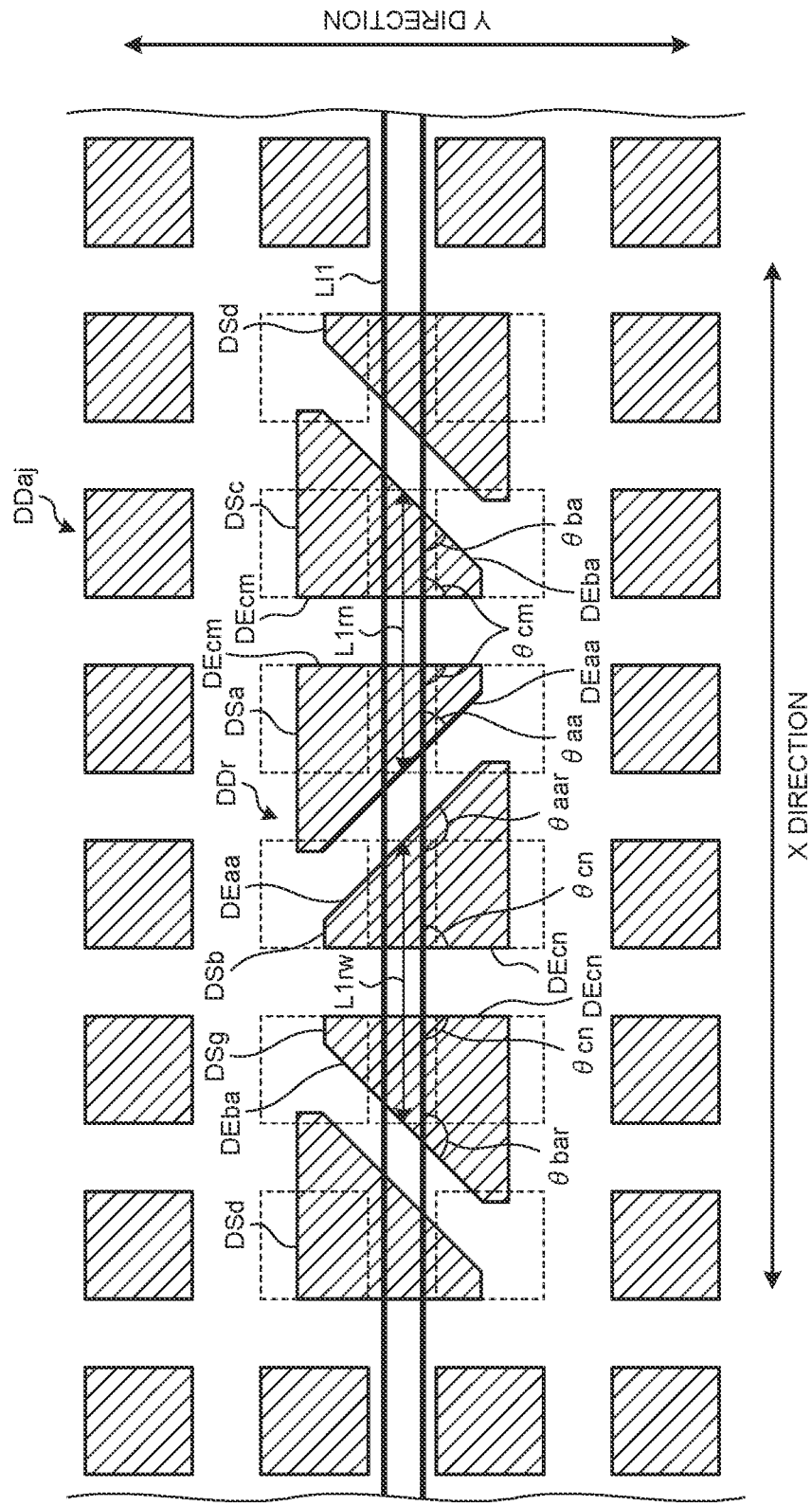
FIG. 24 is a diagram illustrating an example of application of the dummy wiring to the semiconductor device according to the third embodiment.

As illustrated in FIG. 24, in a dummy wiring DDr, the dummy portions DSa and DSc and the dummy portions DSb and DSg are arranged adjacent to each other in the X-direction without being connected to each other, and distances L1$rn$ and L1$rw$ between the outermost edges thereof are measured.

Specifically, in the dummy wiring DDr, a periodic pattern DSd, dummy portions DSg, DSb, DSa, and DSc, and the periodic pattern DSd are arranged in this order in the X-direction in a space equivalent to 12 patterns as the adjustment pattern DDaj.

The two adjacent dummy portions DSa and DSc are arranged at intervals in the X-direction so that their respective edges DEcm are located back to back. In the combination of the two dummy portions DSa and DSc, the measurement target is the distance L1$rn$ between the intersections of the two edges DEaa and DEba facing outward with the contact LI1.

The two adjacent dummy portions DSb and DSg have the arrangement in which the respective dummy portions DSa and DSc are inverted in the X-direction and the Y-direction, and the edges DEcn are arranged at intervals in the X-direction to be located back to back. In the combination of the two dummy portions DSb and DSg, the measurement target is the distance L1$rw$ between the intersections of the two edges DEaa and DEba facing outward with the contact LI1.

As described above, it is possible to calculate the positional deviation amount ΔY of the wiring D2 relative to each configuration of the stacked body LM using a technique similar to the case of using the dummy wiring DD illustrated in the second embodiment described above.

Moreover, the angles θaa and θba of two edges DEaa and DEba of the two respective dummy portions DSa and DSc are, for example, 45°. The angles θaar and θbar of two edges DEaa and DEba of the two respective dummy portions DSb and DSg are, for example, 135°. Thus, in the positional deviation amount measurement using the dummy wiring DDr, the positional deviation amount ΔY is amplified four times.

In this way, in the dummy wiring DDr, the adjacent dummy portions DSa and DSc and the adjacent dummy portions DSb and DSg are arranged at intervals. Accordingly, the areas of the dummy portions DSa, DSb, DSc, and DSg can be kept small. In the CMP when the conductive material is embedded in the dummy portions DSa, DSb, DSc, and DSg, it is possible to prevent or reduce the occurrence of the dishing with a dent near the center of the dummy portions DSa, DSb, DSc, and DSg.

According to the semiconductor device of the third embodiment, effects similar to those of the semiconductor device of the first and second embodiments are achieved.

According to the semiconductor device of the third embodiment, the dummy portion DS including the plurality of edges DE as the measurement target is used. Accordingly, the dummy portion DS configured to have a predetermined area makes it possible to adjust the coverage in the arrangement region of the dummy wiring DD with ease.

Further, according to the above description, it is possible to intend to integrate the dummy wirings DD, reducing its size. In addition, the dummy wiring DD having a simple configuration including an edge extending in the direction along the X-direction, an edge DE extending in the direction along the Y-direction, and an edge DE obliquely intersecting at approximately 45° makes it possible to form the dummy wiring DD more accurately and easily.

Moreover, in the first to third embodiments, the dummy wiring DD is mainly used to measure the positional deviation amount between the wiring D2 and the contact C4. However, the techniques according to the first to third embodiments are applicable to other configurations.

In one example, in the semiconductor device in which the above-mentioned stacked body is arranged directly above a substrate, a peripheral circuit is arranged in the same hierarchy as the stacked body in which stress deformation is likely to occur. In this instance, in some cases, the contact connected to the active region of the peripheral circuit deviates relative to the active region, or the contact connected to the transistor of the peripheral circuit deviates relative to the transistor. In such a case, the arrangement of the structure formed in parallel with the active area or the transistor at a position overlapping with the slit on the stacked body makes it possible to measure the positional deviation amount using the techniques of the first to third embodiments described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate provided with a first hierarchy and a second hierarchy which is above the first hierarchy, the first hierarchy and the second hierarchy being arranged in a stacking direction which is perpendicular to a surface of the substrate;
a lower layer wiring and a dummy wiring arranged in the first hierarchy;
a contact arranged in the second hierarchy and connected to the lower layer wiring; and
first and second plate-like portions arranged in the second hierarchy, the first and second plate-like portions extending in the stacking direction and in a first direction intersecting with the stacking direction, and sandwiching the contact in a second direction intersecting with the stacking direction and the first direction at a position away from the contact,
wherein the dummy wiring has at least three edges arranged at respective positions overlapping with one of the first and second plate-like portions in the stacking direction, and
an orientation in which at least one of the three edges intersects with the first or second plate-like portion differs as viewed from the stacking direction from orientations in which the other edges intersect with the first or second plate-like portion.

2. The semiconductor device according to claim 1, wherein
the dummy wiring includes first and second edges and third and fourth edges, the first and second edges being arranged at respective positions overlapping with the first plate-like portion in the stacking direction and the third and fourth edges being arranged at respective positions overlapping with the second plate-like portion in the stacking direction,
orientations in which the first and second edges intersect with the first plate-like portion differ from each other,
orientations in which the third and fourth edges intersect with the second plate-like portion differ from each other, and
an intersection with the first edge or an extension line of the first edge, on the second edge or an extension line of the second edge and an intersection with the third edge or an extension line of the third edge, on the fourth edge or an extension line of the fourth edge are both located inside or outside a region sandwiched between the first and second plate-like portions.

3. The semiconductor device according to claim 2, wherein
an angle sandwiched between the first edge facing the second edge in the first direction and a first plane of the first plate-like portion facing the second plate-like portion in the second direction is substantially equal to an angle sandwiched between the second edge facing the first edge in the first direction and the first plane of the first plate-like portion, and
an angle sandwiched between the third edge facing the fourth edge in the first direction and a second plane of the second plate-like portion facing the first plate-like portion in the second direction is substantially equal to an angle sandwiched between the fourth edge facing the third edge in the first direction and the second plane of the second plate-like portion.

4. The semiconductor device according to claim 3, wherein
the angle between the first edge and the first plane is more than 0° and less than 90°, and
the angle between the third edge and the second plane is more than 0° and less than 90°.

5. The semiconductor device according to claim 3, wherein
the angle between the first edge and the first plane is more than 90° and less than 180°, and
the angle between the third edge and the second plane is more than 90° and less than 180°.

6. The semiconductor device according to claim 2, wherein
an angle sandwiched between the first edge facing the second edge in the first direction and a first plane of the first plate-like portion facing the second plate-like portion in the second direction is substantially equal to an angle sandwiched between the third edge facing the fourth edge in the first direction and a second plane of the second plate-like portion facing the first plate-like portion in the second direction,
an angle sandwiched between the second edge facing the first edge in the first direction and the first plane of the first plate-like portion is substantially equal to an angle sandwiched between the fourth edge facing the third edge in the first direction and the second plane of the second plate-like portion, the first edge and the first plate-like portion are substantially orthogonal to each other, and the angle between the second edge and the first plane is more than 0° and less than 180°, excluding 90°.

7. The semiconductor device according to claim 2, wherein the dummy wiring includes a first dummy portion having the first edge and a fifth edge facing the first edge and extending in a direction along the first edge, a second dummy portion having the second edge and a sixth edge facing the second edge and extending in a direction along the second edge, a third dummy portion having the third edge and a seventh edge facing the third edge and extending in a direction along the third edge, and a fourth dummy portion having the fourth edge and an eighth edge facing the fourth edge and extending in a direction along the fourth edge.

8. The semiconductor device according to claim 2, wherein the dummy wiring includes a fifth dummy portion having the first edge and the second edge, and a sixth dummy portion having the third edge and the fourth edge.

9. The semiconductor device according to claim 1, wherein the dummy wiring includes first to third edges arranged in this order in the first direction at respective positions overlapping with the first plate-like portion in the stacking direction, an orientation in which the second edge intersects with the first plate-like portion differs from orientations in which the first and third edges intersect with the first plate-like portion, and of a first intersection with the first edge or an extension line of the first edge, on the second edge or an extension line of the second edge and a second intersection with the third edge or an extension line of the third edge, on the second edge or an extension line of the second edge, one of the first and second intersections is on one side of the first plate-like portion in the second direction and, the other of the first and second intersections is on the other side of the first plate-like portion in the second direction.

10. The semiconductor device according to claim 9, wherein an angle sandwiched between the first edge facing the second edge in the first direction and a first plane of the first plate-like portion facing the second plate-like portion in the second direction is more than 0° and 90° or less, and an angle sandwiched between the third edge facing the second edge in the first direction and the first plane of the first plate-like portion is 90° or more and less than 180°.

11. The semiconductor device according to claim 10, wherein the orientation in which the first edge intersects with the first plate-like portion is substantially equal to the orientation in which the third edge intersects with the first plate-like portion.

12. The semiconductor device according to claim 10, wherein the second edge is substantially orthogonal to the first plate-like portion.

13. The semiconductor device according to claim 10, wherein the first and third edges are substantially orthogonal to the first plate-like portion.

14. The semiconductor device according to claim 9, wherein the dummy wiring includes a first dummy portion having the first edge and a fifth edge facing the first edge and extending in a direction along the first edge, a second dummy portion having the second edge and a sixth edge facing the second edge and extending in a direction along the second edge, and a third dummy portion having the third edge and a seventh edge facing the third edge and extending in a direction along the third edge.

15. The semiconductor device according to claim 9, wherein the dummy wiring includes a fifth dummy portion having the first edge and the second edge, and a seventh dummy portion having the third edge.

16. The semiconductor device according to claim 15, wherein the seventh dummy portion has the second edge.

17. The semiconductor device according to claim 15, wherein the seventh dummy portion has a ninth edge facing the third edge and extending in a direction along the third edge.

18. A semiconductor device comprising:

a substrate provided with a first hierarchy and a second hierarchy which is above the first hierarchy, the first hierarchy and the second hierarchy being arranged in a stacking direction which is perpendicular to a surface of the substrate;

a lower layer wiring and a plurality of dummy wirings arranged in the first hierarchy;

a contact arranged in the second hierarchy and connected to the lower layer wiring; and first and second plate-like portions arranged in the second hierarchy, the first and second plate-like portions extending in the stacking direction and in a first direction intersecting with the stacking direction, and sandwiching the contact in a second direction intersecting with the stacking direction and the first direction at a position away from the contact, wherein each of the plurality of dummy wirings has an end extending in the first or second direction and located at a position overlapping with one of the first and second plate-like portions in the stacking direction, the ends of the plurality of dummy wirings are located in different positions between the dummy wirings adjacent to each other, and connecting the ends having different positions causes at least three virtual lines intersecting with the first or second plate-like portion to be obtained, and an orientation in which at least one virtual line of the three virtual lines intersects with the first or second plate-like portion differs from orientations in which the other virtual lines intersect with the first or second plate-like portion.

19. The semiconductor device according to claim 18, wherein connecting the ends of the plurality of dummy wirings cause first and second virtual lines and third and fourth virtual lines to be obtained, the first and second virtual lines being arranged at respective positions overlapping with the first plate-like portion in the stacking direction and the third and fourth virtual lines being arranged at respective positions overlapping with the second plate-like portion in the stacking direction, orientations in which the first and second virtual lines intersect with the first plate-like portion differ from each other, orientations in which the third and fourth virtual lines intersect with the second plate-like portion differ from each other, and an intersection with the second virtual line on the first virtual line and an intersection with the fourth virtual line on the third virtual line are both located inside or outside a region sandwiched between the first and second plate-like portions.

20. The semiconductor device according to claim 18, wherein connecting the ends of the plurality of dummy wirings cause first to third virtual lines arranged in this order in the first direction at respective positions overlapping with the first plate-like portion in the stacking direction to be obtained, an orientation in which the second virtual line intersects with the first plate-like portion differs from orientations in which the first and third virtual lines intersect with the first plate-like portion, and of a first intersection with the second virtual line on the first virtual line and a second intersection with the second virtual line on the third virtual line, one of the first and second intersections is on one side of the first plate-like portion in the second direction, and the other of the first and second intersections is on the other side of the first plate-like portion in the second direction.

* * * * *